United States Patent
Zhu et al.

(10) Patent No.: US 10,714,053 B2
(45) Date of Patent: Jul. 14, 2020

(54) DRIVING CIRCUIT, METHOD FOR CONTROLLING LIGHT EMISSION AND DISPLAY DEVICE

(71) Applicant: Shanghai Tianma AM-OLED Co., Ltd., Shanghai (CN)

(72) Inventors: Renyuan Zhu, Shanghai (CN); Yue Li, Shanghai (CN); Dongxu Xiang, Shanghai (CN); Yana Gao, Shanghai (CN); Xingyao Zhou, Shanghai (CN); Gaojun Huang, Shanghai (CN); Yilin Xu, Shanghai (CN); Zhonglan Cai, Shanghai (CN); Juan Zhu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 16 days.

(21) Appl. No.: 16/191,495

(22) Filed: Nov. 15, 2018

(65) Prior Publication Data

US 2019/0325845 A1 Oct. 24, 2019

(30) Foreign Application Priority Data

Apr. 19, 2018 (CN) .......................... 2018 1 0352530

(51) Int. Cl.
*G09G 5/10* (2006.01)
*G09G 3/20* (2006.01)
*G11C 19/28* (2006.01)

(52) U.S. Cl.
CPC .................. *G09G 5/10* (2013.01); *G09G 3/20* (2013.01); *G11C 19/287* (2013.01); *G09G 2310/0243* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 8,907,335 B2* | 12/2014 | Yamazaki | H01L 27/12 257/43 |
| 2014/0055444 A1* | 2/2014 | Jang | G09G 3/3291 345/213 |

FOREIGN PATENT DOCUMENTS

CN 103632633 A 3/2014

* cited by examiner

*Primary Examiner* — Kenneth B Lee, Jr.
(74) *Attorney, Agent, or Firm* — Tarolli, Sundheim, Covell & Tummino LLP

(57) ABSTRACT

The present disclosure provides a driving circuit, a method for controlling light emission, and a display device. The driving circuit includes one or more light emission shift registers, each of which includes a first processing module configured to control a signal at a first node based on signals at the input signal terminal, the first clock signal terminal and the second clock signal terminal; a second processing module including first and second transistors, wherein the first transistor is a dual-gate transistor, and the second transistor has a first terminal electrically connected to the pulse signal terminal and a second terminal electrically connected to the second node; and an output module configured to control a signal at an output signal terminal based on the signals at the first level signal terminal, the second level signal terminal, the first node and the second node.

19 Claims, 10 Drawing Sheets

US 10,714,053 B2

DRIVING CIRCUIT, METHOD FOR CONTROLLING LIGHT EMISSION AND DISPLAY DEVICE

CROSS-REFERENCE TO RELATED APPLICATIONS

The present disclosure claims priority to Chinese Patent Application No. 201810352530.0, filed on Apr. 19, 2018, the content of which is incorporated herein by reference in its entirety.

TECHNICAL FIELD

The present disclosure relates to the field of display technologies, and in particular, to a driving circuit, a method for controlling light emission, and a display device.

BACKGROUND

Generally, a display device includes a plurality of sub-pixels disposed inside the display panel and a light emission driving circuit that drives light emission of the sub-pixels. The light emission driving circuit generally includes a plurality of cascaded light emission shift registers. In the related art, each stage of light emission shift register needs to be provided with two output terminals, one output terminal is connected to a light emission control line located within a display area, and the other output terminal is connected to an input signal terminal of a next stage of light emission shift register. As a result, the structure of the light emission shift register is complicated and the circuit stability is poor.

SUMMARY

In view of this, the present disclosure provides a driving circuit, a method for controlling light emission, and a display device, which can simplify the structure of the light emission shift register and improve the circuit stability of the light emission shift register.

In a first aspect, the present disclosure provides a driving circuit, including one or more light emission shift registers. Each of the one or more light emission shift registers includes: a first processing module electrically connected to an input signal terminal, a first clock signal terminal and a second clock signal terminal, and configured to control a signal at a first node based on a signal at the input signal terminal, a signal at the first clock signal terminal and a signal at the second clock signal terminal; a second processing module electrically connected to a first level signal terminal, the first clock signal terminal, the second clock signal terminal, a pulse signal terminal and the first node, and configured to control a signal at a second node based on a signal at the first level signal terminal, the signal at the first clock signal terminal, the signal at the second clock signal terminal, a signal at the pulse signal terminal and the signal at the first node, wherein the second processing module includes a first transistor and a second transistor, the first transistor is a dual-gate transistor having a control terminal electrically connected to the first node, a first terminal electrically connected to the first clock signal terminal and a second terminal electrically connected to a third node, and the second transistor has a control terminal electrically connected to the first node or the first clock signal terminal, a first terminal electrically connected to the pulse signal terminal and a second terminal electrically connected to the second node; and an output module electrically connected to the first level signal terminal, a second level signal terminal, the first node and the second node, and configured to control a signal at an output signal terminal based on the signal at the first level signal terminal, a signal at the second level signal terminal, the signal at the first node and the signal at the second node.

In a second aspect, a display device is provided. The display device includes the driving circuit according to the first aspect.

In a third aspect, a method for controlling light emission is provided. The method is applied in the driving circuit according to the first aspect. The method includes: in a first phase, providing a first level signal to the input signal terminal, a second level signal to the first clock signal terminal, and the first level signal to the second clock signal terminal, such that the first level signal is outputted at the output signal terminal; in a second phase, providing the second level signal to the input signal terminal, the first level signal to the first clock signal terminal, and the second level to the second clock signal terminal, such that the first level signal is outputted at the output signal terminal; in a third phase, providing the second level signal to the input signal terminal, the second level signal to the first clock signal terminal, and the first level signal to the second clock signal terminal, such that the second level signal is outputted at the output signal terminal; and in a fourth phase, providing the first level signal to the input signal terminal, the first level signal to the first clock signal terminal, the second level signal to the second clock signal terminal, and the second level signal to the pulse signal terminal, such that the first level signal is outputted at the output signal terminal.

BRIEF DESCRIPTION OF DRAWINGS

In order to illustrate technical solutions in embodiments of the present disclosure, the accompanying drawings used in the embodiments are introduced as follows. It should be noted that the drawings described as follows are part of the embodiments of the present disclosure, other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "I" herein generally indicates that the related objects before and after the character form an "or" relationship.

It should be understood that although the processing module may be described using the terms of "first", "second", etc., in the embodiments of the present disclosure, the processing module will not be limited to these terms. These terms are merely used to distinguish processing modules from one another. For example, without departing from the scope of the embodiments of the present disclosure, a first processing module may also be referred to as a second processing module, and similarly, a second processing module may also be referred to as a first processing module.

In order to better illustrate the technical solutions provided by the embodiments of the present disclosure, the structure of the display device will be described first.

Figure 1:
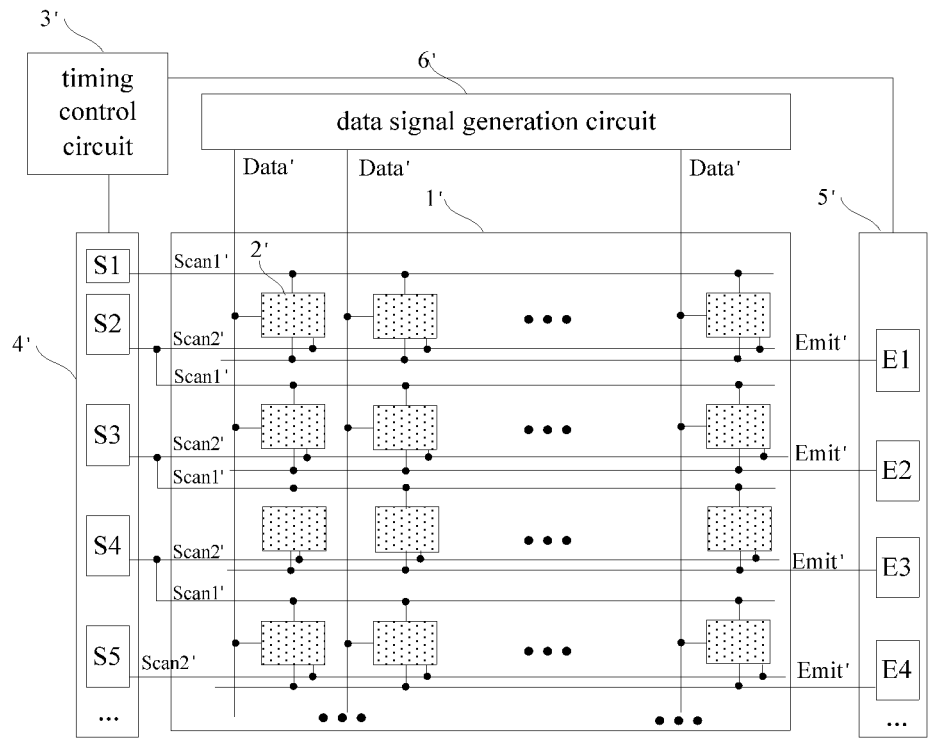
FIG. 1 is a schematic structural diagram of a display device in the prior art.

FIG. 1 is a schematic structural diagram of a display device in the prior art. As shown in FIG. 1, the display device includes a display panel F. The display panel l' is provided thereon with a plurality of sub-pixels 2' that is arranged in m rows and n columns, and each sub-pixel 2' is driven by a respective pixel driving circuit. For example, as shown in the FIG. 2, which is a schematic diagram of a pixel driving circuit in the prior art, the pixel driving circuit includes a first scan signal terminal Scant, a second scan signal terminal Scan2, a data signal terminal Vdata, and a light emission signal terminal Emit.

Figure 2:
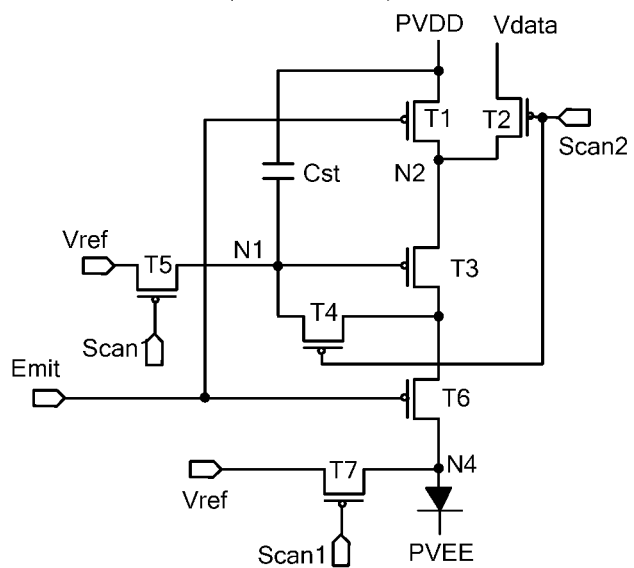
FIG. 2 is a schematic diagram of a pixel driving circuit in the prior art.

With further reference to FIG. 1, the display device further includes a timing control circuit 3', a scan control circuit 4', a light emission control circuit 5', and a data signal generation circuit 6'. The scan control circuit 4' includes m stages of scan shift registers S1, S2, Sm that are cascaded. Each scan shift register has an output terminal. Except for a first stage of scan shift register and a last stage of scan shift register, the output terminal of each stage of scan shift register is connected to its adjacent two rows of sub-pixels 2' via a scan control line Scan2' and a scan control line Scan1'. As shown in FIG. 1 and FIG. 2, the output terminal of a second stage of scan shift register S2 is connected to the second scan signal terminals Scan2 of a first row of sub-pixels 2' via a scan control line Scan2', and to the first scan signal terminals Scant of a second row of sub-pixels 2' via a scan control line Scan1'. The light emission control circuit 5' includes m stages of light emission shift registers E1, E2, . . . , Em that are cascaded. Each light emission shift register has an output terminal. Each output terminal is connected to light emission signal terminals of a respective row of sub-pixels 2' via a respective light emission control line Emit'. The data signal generation circuit 6' has n output terminals, each of which is connected to data signal terminals Vdata of a respective column of sub-pixels 2' via a respective data line Data'. The timing control circuit 3' is connected to the scan control circuit 4' and the light emission control circuit 5', so as to provide respective driving signals to the scan control circuit 4' and the light emission control circuit 5'.

The timing control circuit 3' generates a first driving signal and a second driving signal in response to a received control signal. The scan control circuit 4' generates a scan signal in response to the first driving signal, and the scan signal is sequentially applied to a $1^{st}$ row of sub-pixels 2' to an $M^{th}$ row of sub-pixels 2'. The light emission control circuit 5' is in response to the second driving signal, and m stages of light emission shift registers of the light emission control circuit 5' sequentially generate respective light emission control signals, then the respective light emission control signals are applied to the $1^{st}$ row of sub-pixels 2' to the $m^{th}$ row of sub-pixels 2' via m light emission control lines. A data signal generated by the data signal generation circuit 6' is applied to the $1^{st}$ column of sub-pixels 2' to the $n^{th}$ column of sub-pixels 2' via n data lines Data'.

Figure 3:
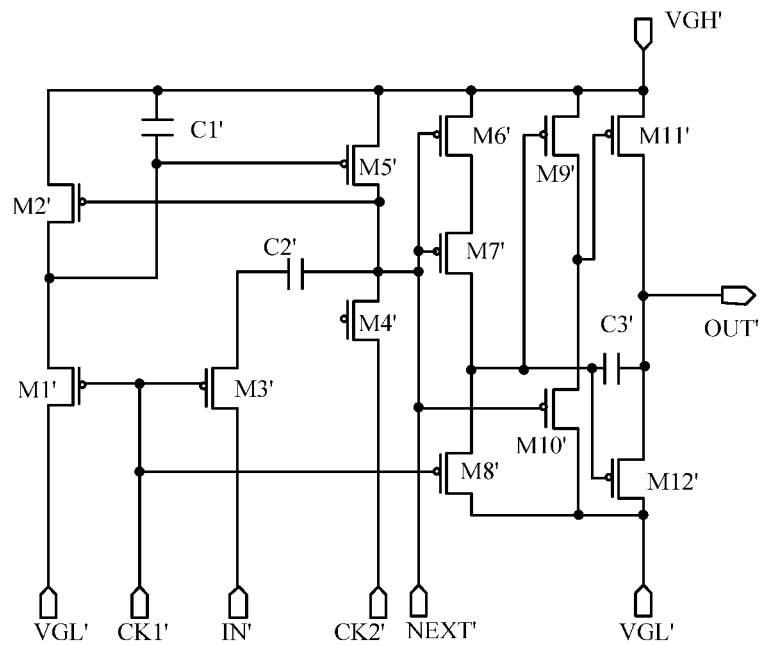
FIG. 3 is a schematic structural diagram of a light emission shift register in the prior art.

FIG. 3 is a schematic structural diagram of a light emission shift register in the prior art. As shown in FIG. 3, the light emission shift register includes a first thin film transistor M1' to a twelfth thin film transistor M12', a first capacitor C1' to a third capacitor C3', a first signal terminal VGH', a second signal terminal VGL', an input signal terminal IN', a first clock signal terminal CK1', a second clock signal terminal CK2', a first output terminal NEXT', and a second output terminal OUT.

With the light emission shift register shown in FIG. 3, a signal received by the input signal terminal IN' and a signal outputted by the second output terminal OUT' have opposite polarities. Therefore, in order to achieve normal operating of the light emission shift register, it is necessary to provide a first output terminal NEXT'. A signal outputted by the first output terminal NEXT and the signal outputted by the second output terminal OUT' have opposite polarities, and the signal outputted by the first output terminal NEXT' and the signal at the input signal terminal IN' have a same opposite polarity. During an implementation, the first output terminal NEXT' is connected to the input signal terminal IN' of a next stage of light emission shift register, and the second output terminal OUT' is connected to light emission signal terminals of a row of sub-pixels in the display panel via light emission control lines. In this way, the signal outputted by the first output terminal NEXT' of the present stage of light emission shift register serves as an input signal for the next stage of light emission shift register, and the signal outputted by the second output terminal OUT' of the present stage of light emission shift register serves as a light emission control signal of a row of sub-pixels in the display panel. As a result, the circuit is complicated.

Figure 4:
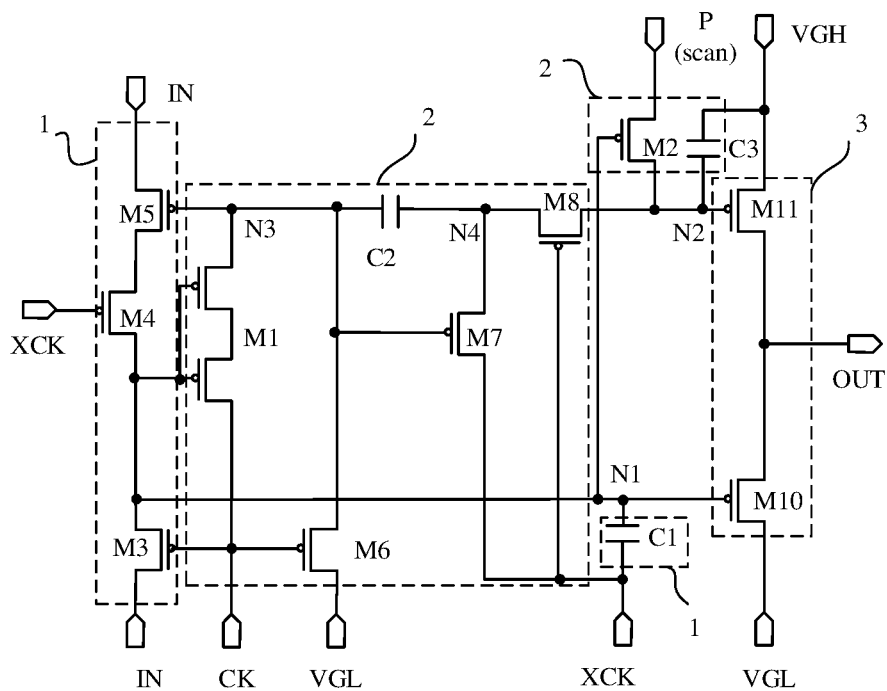
FIG. 4 is a schematic diagram of a light emission shift register according to an embodiment of the present disclosure.

Based on this, an embodiment of the present disclosure provides a light emission shift register. As shown in FIG. 4, which is a schematic diagram of a light emission shift register according to an embodiment of the present disclosure, the light emission shift register includes a first processing module 1, a second processing module 2, and an output module 3.

The first processing module 1 is electrically connected to an input signal terminal IN, a first clock signal terminal CK and a second clock signal terminal XCK, and the first processing module 1 is configured to control a signal at a first node N1 based on a signal at the input signal terminal IN, a signal at the first clock signal terminal CK, and a signal at the second clock signal terminal XCK.

The second processing module 2 is electrically connected to a first level signal terminal VGL, the first clock signal terminal CK, the second clock signal terminal XCK, a pulse signal terminal P and the first node N1, and the second processing module 2 is configured to control a signal at a second node N2 based on a signal at the first level signal terminal VGL, the signal at the first clock signal terminal CK, the signal at the second clock signal terminal XCK, a signal at the pulse signal terminal P, and the signal at the first node N1.

The second processing module 2 includes a first transistor M1 and a second transistor M2. The first transistor M1 is a dual-gate transistor. The dual-gate transistor has a control terminal electrically connected to the first node N1, a first terminal electrically connected to the first clock signal terminal CK, and a second terminal electrically connected to a third node N3. Under control of the first node N1, the dual-gate transistor controls an electrical connection between the first clock signal terminal CK and the third node N3, so as to adjust a potential at the third node N3 by the signal at the first clock signal terminal CK. The second transistor M2 has a control terminal electrically connected to the first node N1, a first terminal electrically connected to the pulse signal terminal P, and a second terminal electrically connected to the second node N2. Under control of the first node N1, the second transistor M2 controls an electrical connection between the pulse signal terminal P and the second node N2, so as to adjust a potential at the second node N2 by the signal at the pulse signal terminal P.

The output module 3 is electrically connected to the first level signal terminal VGL, a second level signal terminal VGH, the first node N1 and the second node N2, and the output module 3 is configured to control a signal at an output signal terminal OUT based on the signal at the first level signal terminal VGL, a signal at the second level signal terminal VGH, the signal at the first node N1, and the signal at the second node N2.

Figure 5:
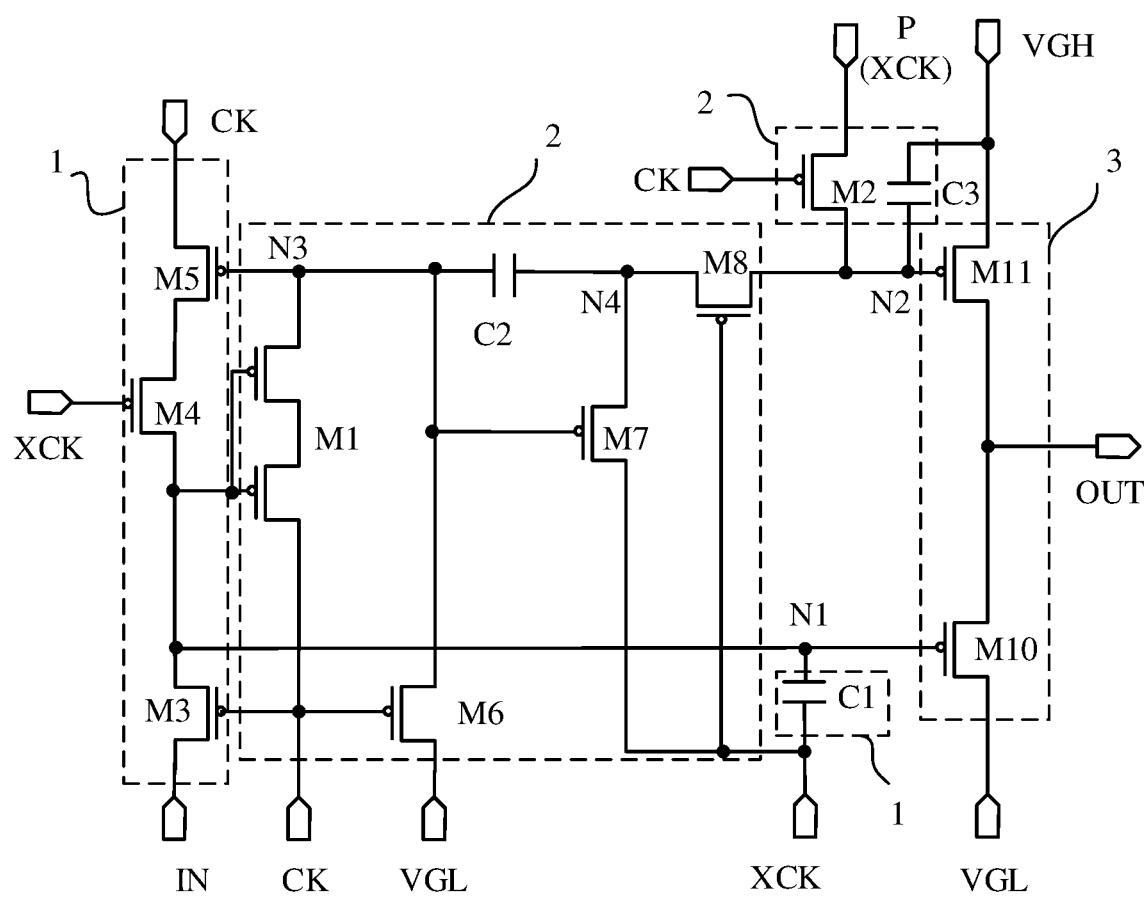
FIG. 5 is a schematic diagram of another light emission shift register according to an embodiment of the present disclosure.

FIG. 5 is a schematic diagram of another light emission shift register according to an embodiment of the present disclosure. In another embodiment, as shown in FIG. 5, unlike the embodiment shown in FIG. 4, the control terminal of the second transistor M2 is connected to the first clock signal terminal CK. In this case, under control of the first clock signal terminal CK, the second transistor M2 controls an electrical connection between the pulse signal terminal P and the second node N2, so as to adjust the potential at the second node N2 by the signal at the pulse signal terminal P. Connections of remaining structures are the same as those of the embodiment shown in FIG. 4, and details will not be further described herein.

Figure 6:
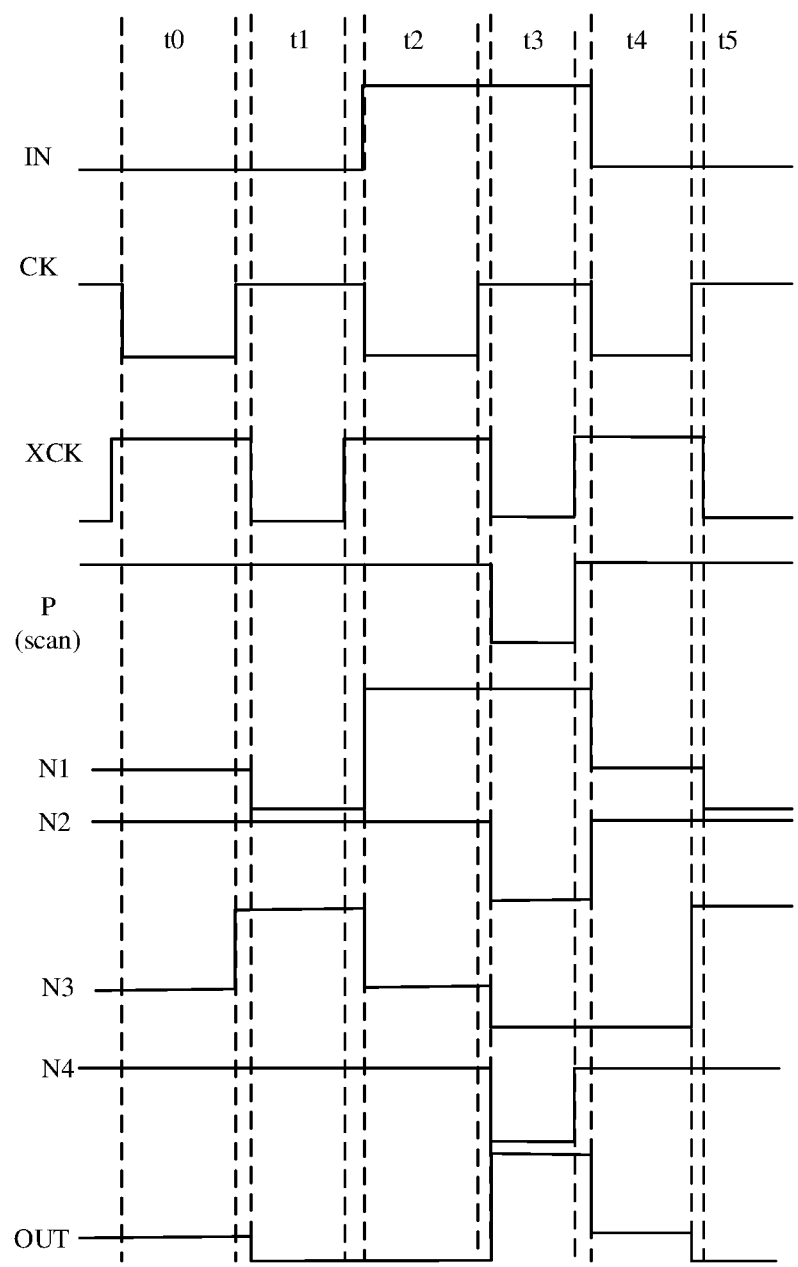
FIG. 6 is an operating sequence diagram corresponding to FIG. 4.
Figure 7:
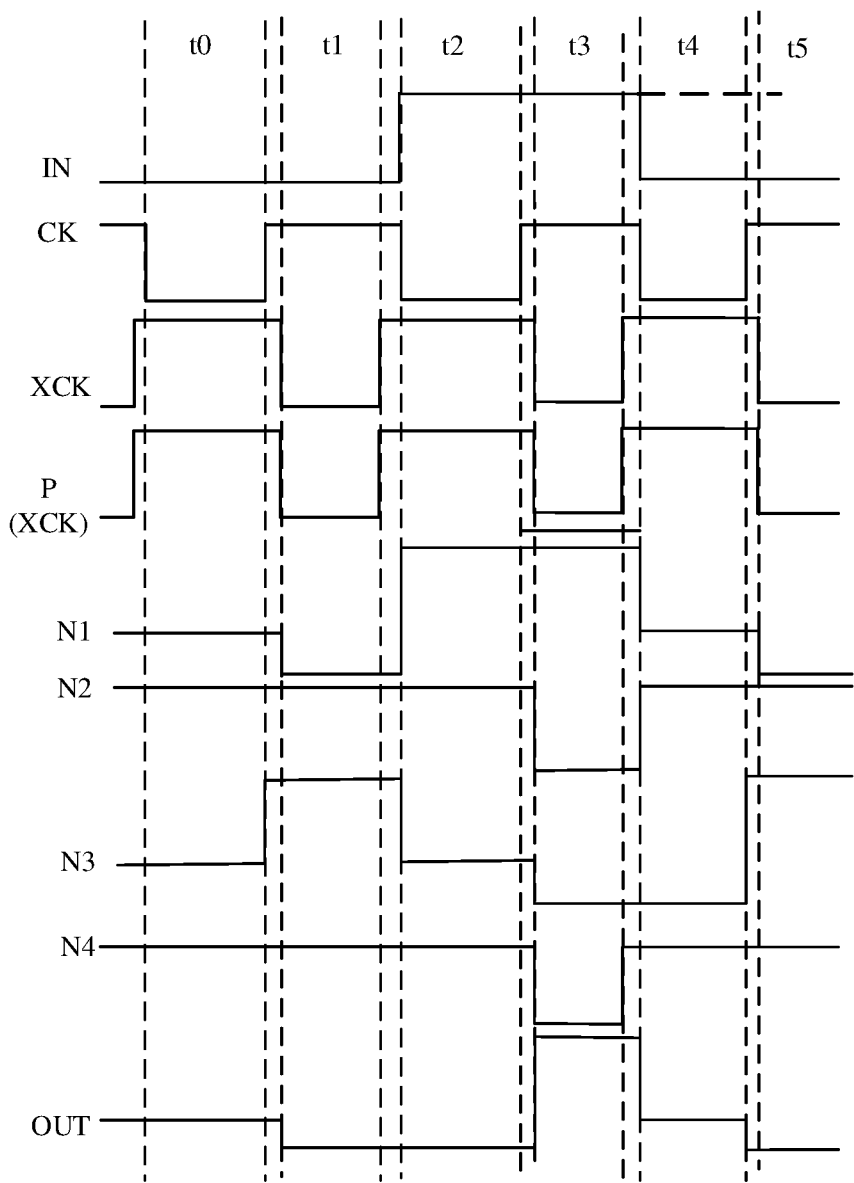
FIG. 7 is an operating sequence diagram corresponding to FIG. 5.

FIG. 6 is an operating sequence diagram corresponding to FIG. 4, and FIG. 7 is an operating sequence diagram corresponding to FIG. 5. As shown in FIG. 6 and FIG. 7, the signal at the pulse signal terminal P satisfies the following conditions.

When the signal at the input signal terminal IN is at a high level, the signal at the first clock signal terminal CK is at a low level, and when the signal at the second clock signal terminal XCK is at a high level, the signal at the pulse signal terminal P will be at a high level.

When the signal at the input signal terminal IN is at a high level, the signal at the first clock signal terminal CK is at a high level, and when the signal at the second clock signal terminal XCK is at a low level, the signal at the pulse signal terminal P will be at a low level.

When the signal at the input signal terminal IN is at a low level, there may be two different cases for the signal at the pulse signal terminal P based on different connections of the control terminal of the second transistor M2.

First Case

As shown in FIG. 4 and FIG. 6, when the control terminal of the second transistor M2 is connected to the first node N1 and the signal at the input signal terminal IN is at a low level, the signal at the pulse signal terminal P will be at a high level. In this case, the signal at the pulse signal terminal P is the same as the scan control signal outputted by the present stage of scan shift register in the scan control circuit. Therefore, during an implementation, the scan signal output terminal scan of the scan control circuit can serve as the pulse signal terminal P of this stage of light emission shift register.

Second Case

As shown in FIG. 5 and FIG. 7, when the control terminal of the second transistor M2 is connected to the first clock signal terminal CK, the signal at the input signal terminal IN is at a low level, the signal at the first clock signal terminal CK is at a high level, and the second clock signal terminal XCK is at low level, the signal at the pulse signal terminal P will be at a low level. When the signal at the input signal terminal IN is at a low level, the signal at the first clock signal terminal CK is at a low level, and the signal at the second clock signal terminal XCK is at a high level, the signal at the pulse signal terminal P will be at a high level. In this case, the signal at the pulse signal terminal P is the same as the signal at the second clock signal terminal XCK. Therefore, during an implementation, the second clock signal terminal XCK can serve as the pulse signal terminal P of this stage of light emission shift register.

For the first case, the operating process of the light emission shift register shown in FIG. 4 will be described with reference to FIG. 4 and FIG. 6. The operating process of the light emission shift register shown in FIG. 4 includes an initial phase t0, a first phase t1, a second phase t2, a third phase t3, a fourth phase t4 and a fifth phase t5.

In the initial phase t0, the first processing module 1 provides a low-level signal to the first node N1 based on a low level at the first clock signal terminal CK and a low level at the input signal terminal IN, so that the first node N1 is at a low level. The second transistor M2 of the second processing module 2 is switched on under control of the first node N1, and the switched-on second transistor M2 provides a high-level signal at the pulse signal terminal P to the second node N2, so that the second node N2 is at a high level. The first transistor M1 is switched on under control of the first node N1, and the switched-on first transistor M1 provides the low-level signal at the first clock signal terminal CK to the third node N3. Based on the low level at the first node N1 and a low level at the first level signal terminal VGL, the output module 3 causes the output signal terminal OUT to output a low level.

In the first phase t1, the first processing module 1 maintains the first node N1 at the low level as in the initial phase t0 based on a high level at the first clock signal terminal CK. The second transistor M2 of the second processing module 2 is switched on under control of the first node N1, and the switched-on second transistor M2 provides a high-level signal at the pulse signal terminal P to the second node N2, so that the second node N2 is at a high level. The first transistor M1 is switched on under control of the first node N1, and the switched-on first transistor M1 provides the high-level signal at the first clock signal terminal CK to the third node N3. Based on the low level at the first node N1 and the low level at a first level signal terminal VGL, the output module 3 causes the output signal terminal OUT to output a low level.

In the second phase t2, the first processing module 1 provides a high level to the first node N1 based on a low-level signal at the first clock signal terminal CK and a high-level signal at the input signal terminal IN. The second processing module 2 maintains the second node at the high level as in the first phase based on a high-level signal at the first node N1 and a high-level signal at the second clock signal terminal XCK. The output module 3 maintains the output signal terminal OUT at the low level as in the first phase t1 based on the high-level signal at the first node N1 and the high-level signal at the second node N2.

In the third phase t3, the first processing module 1 maintains the first node N1 at the high level as in the second phase t2 based on a high-level signal at the first clock signal terminal CK. The second processing module 2 provides a low level to the second node N2 based on a low-level signal at the second clock signal terminal XCK and a low-level signal at the first level signal terminal VGL. Based on a high-level signal at the second level signal terminal VGH and the low-level signal at the second node N2, the output module 3 causes the output signal terminal OUT to output a high level.

In the fourth phase t4, the first processing module 1 provides a low level to the first node N1 based on a low-level signal at the first clock signal terminal CK and a low-level signal at the input signal terminal IN. The second processing module 2 provides a high level to the second node N2 based on the low-level signal at the first node N1 and a high-level signal at the pulse signal terminal P. Based on the low-level signal at the first node N1 and a low-level signal at the first level signal terminal VGL, the output module 3 causes the output signal terminal OUT to output a low level.

In the fifth phase t5, the first processing module 1 maintains the first node N1 at the low level as in the fourth phase t4 based on a high-level signal at the first clock signal terminal CK and a high-level signal at the input signal terminal IN. The second transistor M2 of the second processing module 2 is switched on under control of the first node N1, and the switched-on second transistor M2 provides a high-level signal at the pulse signal terminal P to the second node N2, so that the second node N2 is at a high level. The first transistor M1 is switched on under control of the first node N1, and the switched-on first transistor M1 provides the high-level signal at the first clock signal terminal CK to the third node N3. Based on the low level at the first node N1 and a low level at the first level signal terminal VGL, the output module 3 causes the output signal terminal OUT to output a low level.

For the second case, the operating process of the light emission shift register shown in FIG. 5 will be described with reference to FIG. 5 and FIG. 7. The operating process of the light emission shift register shown in FIG. 5 includes an initial phase t0, a first phase t1, a second phase t2, a third phase t3, a fourth phase t4 and a fifth phase t5.

In the initial phase t0, the first processing module 1 provides a low level to the first node N1 based on a low level at the first clock signal terminal CK and a low level at the input signal terminal IN, so that the first node N1 is at a low level. The second transistor M2 of the second processing module 2 is switched on under control of the first clock signal terminal CK, and the switched-on second transistor M2 provides a high-level signal at the pulse signal terminal P to the second node N2, so that the second node N2 is at a high level. The first transistor M1 is switched on under control of the first node N1, and the switched-on first transistor M1 provides the low-level signal at the first clock signal terminal CK to the third node N3. Based on the low level at the first node N1 and a low level at the first level signal terminal VGL, the output module 3 causes the output signal terminal OUT to output a low level.

In the first phase t1, the first processing module 1 maintains the first node N1 at the low level as in the initial phase t0 based on a high level at the first clock signal terminal CK. The second processing module 2 causes the second node N2 to be at a high level based on the low level at the first node N1, the high level at the first clock signal terminal CK, and a low level at the second clock signal terminal XCK. Based on the low level at the first node N1 and a low level at the first level signal terminal VGL, the output module 3 causes the output signal terminal OUT to output a low level.

In the second phase t2, the first processing module 1 provides a high level to the first node N1 based on a low-level signal at the first clock signal terminal CK and a high-level signal at the input signal terminal IN. The second processing module 2 provides a high level to the second node N2 based on the low-level signal at the first clock signal terminal CK and a high-level signal at the pulse signal terminal P. The output module 3 maintains the output signal terminal OUT at the low level as in the first phase t1 based on the high-level signal at the first node N1 and the high-level signal at the second node N2.

In the third phase t3, the first processing module 1 maintains the first node N1 at the high level as in the second phase t2 based on a high-level signal at the first clock signal terminal CK. The second processing module 2 provides a low level to the second node N2 based on a low-level signal at the second clock signal terminal XCK and a low-level signal at the first level signal terminal VGL. Based on a high-level signal at the second level signal terminal VGH and the low-level signal at the second node N2, the output module 3 causes the output signal terminal OUT to output a high level.

In the fourth phase t4, the first processing module 1 provides a low level to the first node N1 based on a low-level signal at the first clock signal terminal CK and a low-level signal at the input signal terminal IN. The second transistor M2 of the second processing module 2 provides a high level to the second node N2 based on the low-level signal at the first clock signal terminal CK and a high-level signal at the pulse signal terminal P. The first transistor M1 provides a low level to the third node N3 based on the low-level signal at the first node N1 and the low-level signal at the first clock signal terminal CK. Based on the low-level signal at the first node N1 and a low-level signal at the first level signal terminal VGL, the output module 3 causes the output signal terminal OUT to output a low level.

In the fifth phase t5, the first processing module 1 maintains the first node N1 at the low level as in the fourth phase t4 based on a high-level signal at the first clock signal terminal CK and a high-level signal at the input signal terminal IN. The first transistor M1 of the second processing module 2 is switched on under control of the low level at the first node N1, and the switched-on first transistor M1 provides the high-level signal at the first clock signal terminal CK to the third node N3. The second processing module 2 provides a high level to the second node N2 based on the low level at the first node N1 and the high level at the first clock signal terminal CK. Based on the low-level signal at the first node N1 and a low-level signal at the first level signal terminal VGL, the output module 3 causes the output signal terminal OUT to output a low level.

Based on the abovementioned connections of the light emission shift register provided by this embodiment, it is known from the abovementioned description about the operating process of the light emission shift register that, with the light emission shift register provided by this embodiment, the signal output terminal OUT can output an output signal having the same polarity as the input signal at the input signal terminal IN. In other words, for the high-level signal in the second phase t2 and in the third phase t3 provided by the input signal terminal IN, the light emission shift register provided by this embodiment can allow the output signal terminal OUT to output a high-level signal in the third phase t3, thereby achieving shift of signals. Therefore, with the light emission shift register provided by this embodiment, two output terminals in the prior art can be combined into one, that is, one output signal terminal OUT is connected to both the sub-pixels of the display panel and the input signal terminal IN of the next stage of light emission shift register in this embodiment, so that the number of terminals in the circuit can be reduced and the circuit structure of the light emission shift register can be simplified.

In addition, in this embodiment, the second processing module 2 of the light emission shift register includes a first transistor M1 that is a dual-gate transistor. The dual-gate transistor has a control terminal electrically connected to the first node N1, a first terminal electrically connected to the first clock signal terminal CK, and a second terminal electrically connected to a third node N3, so that under control of the first node N1, the signal at the first clock signal terminal CK is applied to the third node N3. The dual-gate transistor has a channel with a large length L. Correspondingly, the channel has a small width-length ratio $$\frac{W}{L},$$

and current flowing through the transistor during operation satisfies that:

$$I = \frac{1}{2}\mu C_{ox}\frac{W}{L}(V_{gs} - |V_{th}|)^2. \quad (1)$$

Here, I is a current flowing through the transistor, $\mu$ is an electron mobility, $C_{ox}$ is a capacitance per unit area of a structure formed by a gate, a gate insulation layer and an active layer of the transistor, $$\frac{W}{L}$$

is the width-length ratio of the channel of the transistor, $V_{gs}$ is a voltage difference between a gate and a source of the transistor, and $V_{th}$ is a threshold voltage of the transistor.

It can be seen from the formula (1) that, since the dual-gate transistor has a small width-length ratio $$\frac{W}{L},$$

the current flowing through the dual-gate transistor is small. In other words, the concentration of active carriers in the dual-gate transistor is reduced, so that the dual-gate transistor has a stable performance, and the dual-gate transistor can withstand a larger dropout voltage applied between its two terminals. Therefore, in this embodiment, the transistor connected between the first node N1 and the third node N3 is set as a dual-gate transistor, so that the withstand voltage performance between the first node N1 and the third node N3 can be improved, thereby resulting in that the light emission shift register can still operate stably with a large dropout voltage between the first node N1 and the third node N3 and thus improving the circuit stability of the light emission shift register.

In summary, with the light emission shift register provided by this embodiment of the present disclosure, on the one hand, the number of terminals in the circuit can be reduced based on the overall connections of the light emission shift register, and the circuit structure of the light emission shift register can be simplified. On the other hand, a dual-gate transistor is provided between the first node N1 and the third node N3 of the second processing module 2 of the light emission shift register, so that the withstand voltage performance between the first node N1 and the third node N3 can be improved, thereby resulting in that the light emission shift register can still operate stably with a large dropout voltage between the first node N1 and the third node N3 and thus improving the circuit stability of the light emission shift register.

In an example, the signal at the first level signal terminal VGL is different from the signal at the second level signal terminal VGH. As shown in FIG. 6 and FIG. 7, both the signal at the first clock signal terminal CK and the signal at the second clock signal terminal XCK are pulse signals. Moreover, when the signal at the first clock signal terminal CK is at a low level, the signal at the second clock signal terminal XCK is at a high level; and when the signal at the second clock signal terminal XCK is at a low level, the signal at the first clock signal terminal CK is a high level.

The circuit structure of the first processing module 1, the second processing module 2, and the output module 3 of the light emission shift register shown in FIG. 4 will be described as examples in the following.

As shown in FIG. 4, in this case, the scan signal output terminal scan of the present stage of scan shift register in the scan control circuit serves as the pulse signal terminal P of the light emission shift register, and the control terminal of the second transistor M2 is connected to the first node N1.

The first processing module 1 includes a third transistor M3, a fourth transistor M4, a fifth transistor M5, and a first capacitor C1. The third transistor M3 has a control terminal electrically connected to the first clock signal terminal CK, a first terminal electrically connected to the input signal terminal IN, and a second terminal electrically connected to the first node N1. Under control of the signal provided by the first clock signal terminal CK, the third transistor M3 controls an electrical connection between the input signal terminal IN and the first node N1, so as to adjust the potential at the first node N1.

The fourth transistor M4 has a control terminal electrically connected to the second clock signal terminal XCK, a first terminal electrically connected to the first node N1, and a second terminal. The transistor M5 has a control terminal electrically connected to the third node N3, a first terminal electrically connected to the second terminal of the fourth transistor M4, and a second terminal electrically connected to the input signal terminal IN. Under control of the signals provided by the second clock signal terminal XCK and the third node N3, the fourth transistor M4 and the fifth transistor M5 control an electrical connection between the input signal terminal IN and the first node N1, so as to adjust the potential at the first node N1.

The first capacitor C1 has a first terminal electrically connected to the first node N1, and a second terminal electrically connected to the second clock signal terminal XCK. The first capacitor C1 is configured to maintain the first node N1 at the potential state as in the previous operating phase through a coupling effect of the first capacitor C1 when the first node N1 is in a floating state.

In an example of this embodiment, the first transistor M1, the second transistor M2, the third transistor M3, the fourth transistor M4, and the fifth transistor M5 are all PMOS transistors. The PMOS transistor is switched on when its control terminal is at a low level, and is switched off when its control terminal is at a high level. Unless otherwise stated, the transistors mentioned later in this embodiment are all PMOS transistors. During an implementation, the gate electrode of each transistor is used as its control terminal. Moreover, according to the signal at the gate electrode of each transistor and its type, it is possible that the first terminal thereof is used as the source electrode and the second terminal is used as the drain electrode, or it is also possible that the first terminal is used as the drain electrode and the second terminal is used as the source electrode, which will not be limited herein.

With further reference to FIG. 4, the second processing module 2 further includes a sixth transistor M6, a seventh transistor M7, an eighth transistor M8, a second capacitor C2, and a third capacitor C3.

The sixth transistor M6 has a control terminal electrically connected to the first clock signal terminal CK, a first terminal electrically connected to the first level signal terminal VGL, and a second terminal electrically connected to the third node N3. Under control of the signal provided by the first clock signal terminal CK, the sixth transistor M6 controls an electrical connection between the first level signal terminal VGL and the third node N3, so as to adjust the potential at the third node N3 by the signal at the first level signal terminal VGL.

The seventh transistor M7 has a control terminal electrically connected to the third node N3, a first terminal electrically connected to the second clock signal terminal XCK, and a second terminal electrically connected to the fourth node N4. Under control of the third node N3, the seventh transistor M7 controls an electrical connection between the second clock signal terminal XCK and the fourth node N4, so as to adjust the potential at the fourth node N4 by the signal at the second clock signal terminal XCK.

The eighth transistor M8 has a control terminal electrically connected to the second clock signal terminal XCK, a first terminal electrically connected to the fourth node N4, and a second electrically connected to the second node N2. Under control of the signal provided by the second clock signal terminal XCK, the eighth transistor M8 controls an electrical connection between the fourth node N4 and the second node N2, so as to adjust the potential at the second node N2 by the signal at the fourth node N4.

The second capacitor C2 has a first terminal electrically connected to the third node N3, and a second terminal electrically connected to the fourth node N4. The second capacitor C2 is configured to maintain the third node N3 and the fourth node N4 at the potential states as in the previous operating phase through a coupling effect of the second capacitor C2 when the third node N1 and the fourth node 4 are in a floating state.

The third capacitor C3 has a first terminal electrically connected to a fixed level signal terminal, for example, the first level signal terminal VGL or the second level signal terminal VGH, which is not limited herein in this embodiment. As shown in FIG. 4, it is taken as an example that the first terminal of the third capacitor C3 is electrically connected to the second level signal terminal VGH, and the second terminal of the third capacitor C3 is electrically connected to the second node N2. The third capacitor C3 is configured to maintain the second node N2 at the potential state as in the previous operating phase through a coupling effect of the third capacitor C3 when the second node N2 is in a floating state.

With further reference to FIG. 4, the output module 3 includes a tenth transistor M10 and an eleventh transistor M11. The tenth transistor M10 has a control terminal electrically connected to the first node N1, a first terminal electrically connected to the first level signal terminal VGL, and a second terminal electrically connected to the output signal terminal OUT. Under control of the first node N1, the tenth transistor M10 controls an electrical connection between the first level signal terminal VGL and the output signal terminal OUT, so as to adjust the output signal at the output signal terminal OUT by the first level signal terminal VGL.

The eleventh transistor M11 has a control terminal electrically connected to the second node N2, a first terminal electrically connected to the second level signal terminal VGH, and a second terminal electrically connected to the output signal terminal OUT. Under control of the second node N2, the eleventh transistor M11 controls an electrical connection between the second level signal terminal VGH and the output signal terminal OUT, so as to adjust the output signal at the output signal terminal OUT by the second level signal terminal VGH.

As shown in FIG. 4 and FIG. 6, the operating process of the first processing module 1, the second processing module 2, and the output module 3 of the light emission shift register shown in FIG. 4 will be described in the following.

In the initial phase t0, the first clock signal terminal CK provides a low level, so that the third transistor M3 and the sixth transistor M6 are switched on. The third transistor M3 writes a low-level signal provided by the input signal terminal IN into the first node N1 so as to make the first node N1 at a low level, so that the first transistor M1, the second transistor M2 and the tenth transistor M10 are switched on. The first transistor M1 writes the low-level signal provided by the first clock signal terminal CK into the third node N3, and the sixth transistor M6 writes a low-level signal provided by the first level signal terminal VGL into the third node N3, so that the third node N3 is at a low level. The fifth transistor M5 and the seventh transistor M7 are switched on. The seventh transistor M7 writes a high-level signal provided by the second clock signal terminal XCK into the fourth node N4. The second transistor M2 writes a high-level signal provided by the scan signal output terminal scan to the second node N2, so that the second node N2 is at a high level. The tenth transistor M10 writes the low-level signal provided by the first level signal terminal VGL into the output signal terminal OUT, so that the output signal terminal OUT outputs a low level.

In the first phase t1, which is a pre-shift preparation phase of this light emission shift register, the first clock signal terminal CK provides a high level, so that the third transistor M3 and the sixth transistor M6 are switched off. The first node N1 is maintained at the low level as in the initial phase t0. The first transistor M1, the second transistor M2 and the tenth transistor M10 are switched on. The first transistor M1 writes the high-level signal provided by the first clock signal terminal CK into the third node N3, so that the third node N3 is at a high level. The fifth transistor M5 and the seventh transistor M7 are switched off. The fourth node N4 is maintained at the high level as in the initial phase t0. The second transistor M2 writes a high-level signal provided by the scan signal output terminal scan into the second node N2, and the second clock signal terminal XCK provides a low-level signal, so that the fourth transistor M4 and the eighth transistor M8 are switched on. The eighth transistor M8 provides the high level at the fourth node N4 to the second node N2, so that the second node N2 is at a high level. The eleventh transistor M11 is switched off. Moreover, since the potential at the second clock signal terminal XCK changes from a high level to a low level, the potential at the first node N1 can be lower through a coupling effect of the first capacitor C1, so that the tenth transistor M10 can losslessly write a low-level signal provided by the first level signal terminal VGL into the output signal terminal OUT, and thus the output signal terminal OUT outputs a low level.

In the second phase t2, which is a valid level writing phase of the light emission shift register, a valid level is written by the input signal terminal IN. In other words, in this embodiment, the input signal terminal IN is provided with a high level, and the first clock signal terminal CK provides a low level, so that the third transistor M3 and the sixth transistor M6 are switched on. The third transistor M3 writes a high-level signal provided by the input signal terminal IN into the first node N1, so that the first node N1 is at a high level, and thus the first transistor M1, the second transistor M2, and the tenth transistor M10 are switched off. The sixth transistor M6 writes a low-level signal provided by the first level signal terminal VGL into the third node N3, so that the third node N3 is at a low level. The fifth transistor M5 and the seventh transistor M7 are switched on. The seventh transistor M7 writes a high-level signal provided by the second clock signal terminal XCK into the fourth node N4. The second clock signal terminal XCK provides a high-level signal, so that the eighth transistor M8 is switched off. The second node N2 is maintained at the high level as in the first phase t1, so that the eleventh transistor M11 is switched off. The output signal terminal OUT is maintained at the low level as in the first phase t1.

In the third phase t3, which is a shift phase of the light emission shift register, the first clock signal terminal CK provides a high level, so that the third transistor M3 and the sixth transistor M6 are switched off. The first node N1 is maintained at the high level as in second phase t2, so that the first transistor M1, the second transistor M2 and the tenth transistor M10 are switched off. The third node N3 is maintained at the low level as in the second phase t2. The fifth transistor M5 and the seventh transistor M7 are switched on. The second clock signal terminal XCK provides a low-level signal. The fourth transistor M4 and the eighth transistor M8 are switched on. The switched-on fifth transistor M5 and fourth transistor M4 write a high-level signal provided by the input signal terminal IN into the first node N1, so that the first node N1 is at a high level. The switched-on seventh transistor M7 writes the low-level signal provided by the second clock signal terminal XCK into the fourth node N4, so that the fourth node N4 is at a low level. The switched-on eighth transistor M8 provides the low level at the fourth node N4 to the second node N2, so that the second node N2 is at a low level. The eleventh transistor M11 is switched on. The switched-on eleventh transistor M11 provides a high-level signal provided by a second fixed potential terminal VGH to the output signal terminal OUT, so that the output signal terminal OUT outputs a high level. Moreover, since the potential at the fourth node N4 changes from a high potential to a low potential, the potential at the third node N3 can be lower through a coupling effect of the second capacitor C2, so that the sixth transistor M6 can losslessly transmit the low-level signal at the second clock signal terminal XCK to the fourth node N4.

In the fourth phase t4, the first clock signal terminal CK provides a low level, so that the third transistor M3 and the sixth transistor M6 are switched on. The third transistor M3 writes a low-level signal provided by the input signal terminal IN into the first node N1, so that the first node N1 is at a low level, and thus the first transistor M1, the second transistor M2 and the tenth transistor M10 are switched on. The switched-on first transistor M1 writes the low-level signal provided by the first clock signal terminal CK into the third node N3, and the sixth transistor M6 writes a low-level signal provided by the first level signal terminal VGL into the third node N3, so that the third node N3 is at a low level, and thus the fifth transistor M5 and the seventh transistor M7 are switched on. The seventh transistor M7 writes a high-level signal provided by the second clock signal terminal XCK into the fourth node N4. The switched-on second transistor M2 writes a high-level signal provided by the scan signal output terminal scan to the second node N2, so that the second node N2 is at a high level. The eleventh transistor M11 is switched off. The switched-on tenth transistor M10 writes the low-level signal provided by the first level signal terminal VGL to the output signal terminal OUT, so that the output signal terminal OUT outputs a low level.

In the fifth phase t5, the first clock signal terminal CK provides a high level, so that the third transistor M3 and the sixth transistor M6 are switched off. The first node N1 is maintained at the low level as in the fourth phase t4, so that the first transistor M1, the second transistor M2 and the tenth transistor M10 are switched on. The switched-on first transistor M1 writes the high-level signal provided by the first clock signal terminal CK into the third node N3, so that the third node N3 is at a high level, and the fifth transistor M5 and the seventh transistor M7 are switched off. The fourth node N4 is maintained at the high level as in the fourth phase t4. Since the signal at the second clock signal terminal XCK changes from a high level to a low level, the potential at the first node N1 can be lower through the coupling effect of the first capacitor C1, so that the tenth transistor M10 can losslessly transmit the signal at the first level signal terminal VGL to the output signal terminal OUT, and thus the output signal terminal OUT outputs a low level. Meanwhile, the eighth transistor M8 is switched on, and the high-level signal at the fourth node N4 is transmitted to the second node N2. The switched-on second transistor M2 transmits a high-level signal provided by the scan signal output terminal scan to the second node N2, so that the second node N2 is at a high level, and the eleventh transistor M11 is switched off.

The above description is an example of the circuit structure of the first processing module 1, the second processing module 2 and the output module 3 of the light emission shift register shown in FIG. 4. For the light emission shift register shown in FIG. 5, the second clock signal terminal XCK serves as the pulse signal terminal P of the light emission shift register, the control terminal of the second transistor M2 is connected to the first clock signal terminal CK, and the remaining part of the structure is the same as the connection shown in FIG. 4, and will not be further described herein.

As shown in FIG. 5 and FIG. 7, the operating process of the first processing module 1, the second processing module 2, and the output module 3 of the light emission shift register shown in FIG. 5 will be described in the following.

In the initial phase t0, the first clock signal terminal CK provides a low level, so that the second transistor M2, the third transistor M3, and the sixth transistor M6 are switched on. The switched-on second transistor M2 writes a high-level signal provided by the second clock signal terminal XCK into the second node N2, so that the second node N2 is at a high level. The eleventh transistor M11 is switched off. The switched-on third transistor M3 writes a low-level signal provided by the input signal terminal IN into the first node N1, so that the first node N1 is at a low level, and thus the first transistor M1 and the tenth transistor M10 are switched on. The first transistor M1 writes the low-level signal provided by the first clock signal terminal CK into the third node N3, and the sixth transistor M6 writes a low-level signal provided by the first level signal terminal VGL into the third node N3, so that the third node N3 is at a low level. The fifth transistor M5 and the seventh transistor M7 are switched on, and the switched-on seventh transistor M7 writes a high-level signal provided by the second clock signal terminal XCK into the fourth node N4. The switched-on tenth transistor M10 writes the low-level signal provided by the first level signal terminal VGL into the output signal terminal OUT, so that the output signal terminal OUT outputs a low level.

In the first phase t1, which is a pre-shift preparation phase of the light emission shift register, the first clock signal terminal CK provides a high level, so that the second transistor M2, the third transistor M3 and the sixth transistor M6 are switched off. The first node N1 is maintained at the low level as in the initial phase t0. The first transistor M1 and the tenth transistor M10 are switched on. The first transistor M1 writes the high-level signal provided by the first clock signal terminal CK into the third node N3, so that the third node N3 is at a high level. The fifth transistor M5 and the seventh transistor M7 are switched off. The fourth node N4 is maintained at the high level as in the initial phase t0. The second clock signal terminal XCK provides a low-level signal, so that the fourth transistor M4 and the eighth transistor M8 are switched on. The eighth transistor M8 provides the high level at the fourth node N4 to the second node N2, so that the second node N2 is at a high level, and thus the eleventh transistor M11 is switched off. Moreover, since the potential at the second clock signal terminal XCK changes from a high level to a low level, the potential at the first node N1 can be lower through a coupling effect of the first capacitor C1, so that the tenth transistor M10 can losslessly write a low-level signal provided by the first level signal terminal VGL into the output signal terminal OUT, which in turn outputs a low level.

In the second phase t2, which is a valid level writing phase of the light emission shift register, a valid level is written through the input signal terminal IN. In other words, in this embodiment, the input signal terminal IN is provided with a high level, and the first clock signal terminal CK provides a low level, so that the second transistor M2, the third transistor M3, and the sixth transistor M6 are switched on. The switched-on second transistor M2 writes a high level provided by the second clock signal terminal XCK into the second node N2, so that the eleventh transistor M11 is switched off. The switched-on third transistor M3 writes the high-level signal provided by the input signal terminal IN into the first node N1, so that the first node N1 is at a high level, and the first transistor M1 and the tenth transistor M10 are switched off. The switched-on sixth transistor M6 writes a low-level signal provided by the first level signal terminal VGL into the third node N3, so that the third node N3 is at a low level, and thus the fifth transistor M5 and the seventh transistor M7 are switched on. The seventh transistor M7 writes the high-level signal provided by the second clock signal terminal XCK into the fourth node N4. The second clock signal terminal XCK provides a high-level signal, so that the eighth transistor M8 is switched off. The output signal terminal OUT is maintained at the low level as in the first phase t1.

In the third phase t3, which is a shift phase of the light emission shift register, the first clock signal terminal CK provides a high level, so that the second transistor M2, the third transistor M3 and the sixth transistor M6 are switched off. The first node N1 is maintained at the high level as in the second phase t2, so that the first transistor M1 and the tenth transistor M10 are switched off. The third node N3 is maintained at the low level as in the second phase t2, so that the fifth transistor M5 and the seventh transistor M7 are switched on. The second clock signal terminal XCK provides a low-level signal, so that the fourth transistor M4 and the eighth transistor M8 are switched on. The switched-on fifth transistor M5 and fourth transistor M4 write a high-level signal provided by the input signal terminal IN into the first node N1, so that the first node N1 is at a high level. The switched-on seventh transistor M7 writes the low-level signal provided by the second clock signal terminal XCK into the fourth node N4, so that the fourth node N4 is at a low level. The switched-on eighth transistor M8 provides the low level at the fourth node N4 to the second node N2, so that the second node N2 is at a low level. The eleventh transistor M11 is switched on. The switched-on eleventh transistor M11 provides a high-level signal provided by the second fixed potential terminal VGH to the output signal terminal OUT, so that the output signal terminal OUT outputs a high level. Moreover, since the potential at the fourth node N4 changes from a high potential to a low potential, the potential at the third node N3 can be lower through a coupling effect of the second capacitor C2, so that the sixth transistor M6 can losslessly provide a low-level signal at the second clock signal terminal XCK to the fourth node N4.

In the fourth phase t4, the first clock signal terminal CK provides a low level, so that the second transistor M2, the third transistor M3, and the sixth transistor M6 are switched on. The switched-on second transistor M2 writes a high-level signal provided by the second clock signal terminal XCK into the second node N2, so that the eleventh transistor M11 is switched off. The switched-on third transistor M3 writes a low-level signal provided by the input signal terminal IN into the first node N1, so that the first node N1 is at a low level, and thus the first transistor M1 and the tenth transistor M10 are switched on. The switched-on first transistor M1 writes the low-level signal provided by the first clock signal terminal CK into the third node N3, and the sixth transistor M6 writes a low-level signal provided by the first level signal terminal VGL into the third node N3, so that the third node N3 is at a low level, and thus the fifth transistor M5 and the seventh transistor M7 are switched on. The seventh transistor M7 writes the high-level signal provided by the second clock signal terminal XCK to the fourth node N4. The switched-on tenth transistor M10 writes a low-level signal provided by the first level signal terminal VGL into the output signal terminal OUT, so that the output signal terminal OUT outputs a low level.

In the fifth phase t5, the first clock signal terminal CK provides a high level, so that the second transistor M2, the third transistor M3 and the sixth transistor M6 are switched off. The first node N1 is maintained at the low level as in the fourth phase t4, so that the first transistor M1 and the tenth transistor M10 are switched on. The switched-on first transistor M1 writes the high-level signal provided by the first clock signal terminal CK into the third node N3, so that the third node N3 is at a high level, and thus the fifth transistor M5 and the seventh transistor M7 are switched off. The fourth node N4 is maintained at the high level as in the fourth phase t4, and the signal at the second clock signal terminal XCK changes from a high level to a low level, so that the potential at the first node N1 can be lower through the coupling effect of the first capacitor C1, and thus the tenth transistor M10 can losslessly transmit a signal at the first level signal terminal VGL to the output signal terminal OUT, so that the output signal terminal OUT outputs a low level. Meanwhile, the eighth transistor M8 is switched on, and the high-level signal at the fourth node N4 is transmitted to the second node N2, so that the eleventh transistor M11 is switched off.

For the light emission shift register shown in FIG. 4 and FIG. 5, subsequent operating states repeat the states of the fourth phase t4 and the fifth phase t5 till a next high level occurs at the input signal terminal IN.

Figure 8:
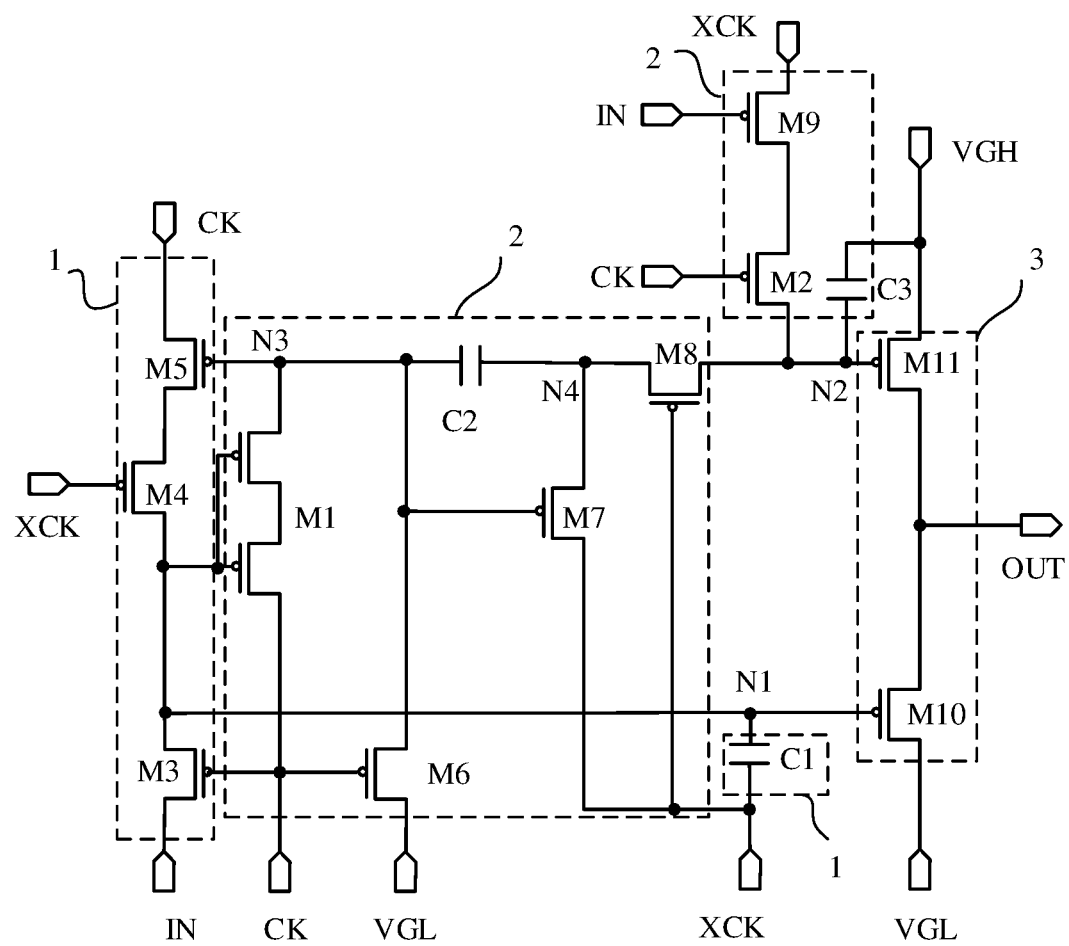
FIG. 8 is a schematic diagram of still another light emission shift register according to an embodiment of the present disclosure.

In an embodiment, a ninth transistor M9 may be further provided in the light emission shift register shown in FIG. 5. FIG. 8 is a schematic diagram of still another light emission shift register according to an embodiment of the present disclosure. As shown in FIG. 8, the second processing module 2 further includes a ninth transistor M9. The ninth transistor M9 has a control terminal electrically connected to the input signal terminal IN, a first terminal electrically connected to the second clock signal terminal XCK, and a second terminal electrically connected to the first terminal of the second transistor M2.

In this embodiment, the ninth transistor M9 can be connected to one terminal of the second transistor M2. For example, the control terminal of the ninth transistor M9 is connected to the input signal terminal IN, the first terminal of the ninth transistor M9 is electrically connected to the second clock signal terminal XCK, and the second terminal of the ninth transistor M9 is electrically connected to the first terminal of the second transistor M2. In this way, when the light emission shift register is used in a diming mode, since the input signal terminal IN is at a high level for a long time in the diming mode (denoted as the dotted line in the fourth phase t4 in FIG. 7 for the input signal terminal IN), if the light emission shift register shown in FIG. 5 is directly used in the dimming mode, the first clock signal terminal CK provides a low level in the fourth phase t4, so that the second transistor M2, the third transistor M3 and the sixth transistor M6 are switched on. The switched-on second transistor M2 writes a high-level signal provided by the second clock signal terminal XCK into the second node N2, so that the eleventh transistor M11 is switched off. The switched-on third transistor M3 writes the high-level signal provided the input signal terminal IN into the first node N1, so that the first node N1 is at a high level, and thus the tenth transistor M10 is switched off. That is, when the light emission shift register shown in FIG. 5 is used in the dimming mode, both the first transistor M1 and the tenth transistor M10 are switched off in the fourth phase t4. In this case, the output signal terminal OUT is in a floating state, resulting in that the circuit of the light emission shift register is unstable. In the embodiment shown in FIG. 8, a ninth transistor M9 is provided. Thus, when the light emission shift register is used in a dimming mode, the first clock signal terminal CK provides a low level in the fourth phase t4, so that the second transistor M2, the third transistor M3 and the sixth transistor M6 are switched on. However, since the control terminal of the ninth transistor M9 is electrically connected to the input signal terminal IN in this case, and the input signal terminal IN provides a high level in this phase, the ninth transistor M9 is switched off at this time, and the second node N2 will not be written to a high level by the high-level signal provided by the second clock signal terminal XCK but will be remained at the low level as in the previous phase, i.e., the third phase t3, so that the eleventh transistor M11 is switched on and thus the signal at the second fixed potential terminal VGH can be stably provided to the output signal terminal OUT, thereby achieving stability of the output signal. Therefore, in the dimming mode, the light emission shift register shown in FIG. 8 can avoid floating of the output signal terminal OUT, and thus the circuit of the light emission shift register can be more stable.

Figure 9:
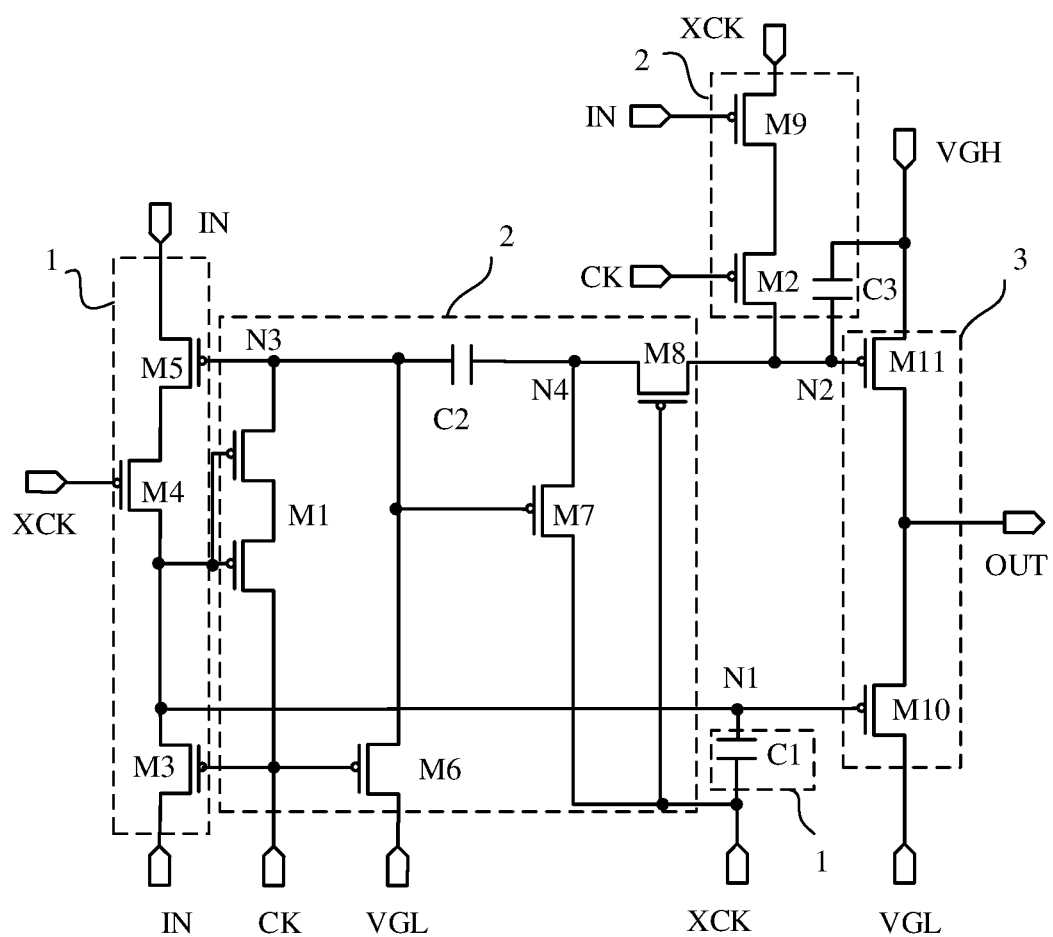
FIG. 9 is a schematic diagram of yet another light emission shift register according to an embodiment of the present disclosure.

FIG. 9 is a schematic diagram of yet another light emission shift register according to an embodiment of the present disclosure. In an embodiment, as shown in FIG. 9, the first terminal of the abovementioned fifth transistor M5 is connected to the input signal terminal IN. The first terminal of the fifth transistor M5 is connected to the input signal terminal IN, and the remaining part of the structure is the same as that shown in FIG. 8, and details thereof will not be further described herein. Moreover, it is known from the above analysis that, the phases in which the potential at the third node N3 is low are the second phase t2 to the fourth phase t4, and in the three phases, the phase in which the potential at the second clock signal terminal XCK is low is the third phase t3. In the third phase t3, the signal at the input signal terminal IN and the signal at the first clock signal terminal CK have a same level, which is a high level. Therefore, the light emission shift register shown in FIG. 9 can achieve effective operating of the circuit.

An embodiment of the present disclosure further provides a method for controlling light emission, and the method is applied in the abovementioned light emission shift register. As shown in FIG. 6 and FIG. 7, the operating process of the light emission shift register includes an initial phase t0, a first phase t1, a second phase t2, a third phase t3 and a fourth phase t4.

In the initial phase t0, the input signal terminal IN is provided with a first level signal, the first clock signal terminal CK is provided with the first level signal, and the second clock signal terminal XCK is provided with a second level signal, such that the output signal terminal OUT outputs the first level signal.

In the first phase t1, the input signal terminal IN is provided with the first level signal, the first clock signal terminal CK is provided with the second level signal, and the second clock signal terminal XCK is provided with the first level signal, such that the output signal terminal OUT outputs the first level signal.

In the second phase t2, the input signal terminal IN is provided with the second level signal, the first clock signal terminal CK is provided with the first level signal, and the second clock signal terminal XCK is provided with the second level signal, such that the output signal terminal OUT outputs the first electric signal.

In the third phase t3, the input signal terminal IN is provided with the second level signal, the first clock signal terminal CK is provided with the second level signal, and the second clock signal terminal XCK is provided with the first level signal, such that the output signal terminal OUT outputs the second level signal.

In the fourth phase t4, the input signal terminal IN is provided with the first level signal, the first clock signal terminal CK is provided with the first level signal, and the second clock signal terminal XCK is provided with the second level signal, the pulse signal terminal P is provided with the second level signal, such that the output signal terminal OUT outputs the first level signal.

The driving process of the light emission shift register has been described in detail in the above embodiments, and will not be further described herein.

With the method for controlling light emission in this embodiment, the output signal terminal OUT of the light emission shift register can output an output signal which has a same polarity with the signal at the input signal terminal IN. That is, for high-level signals provided by the input signal terminal IN in the second phase t2 and in the third phase t3, the light emission shift register provided in this embodiment can output a high-level signal in the third phase t3 so as to achieve signal shift. Therefore, with the method for controlling light emission in this embodiment, two output terminals of the light emission shift register in the prior art can be combined as one, that is, one output signal terminal OUT is connected to both the sub-pixels of the display panel and the input signal terminal IN of a next stage of light emission shift register, so that the number of terminals in the circuit can be reduced and the circuit structure of the light emission shift register can be simplified. Moreover, in this embodiment, a dual-gate transistor is provided between the first node N1 and the third node N3 of the second processing module 2 of the light emission shift register, so that the withstand voltage performance between the first node N1 and the third node N3 can be improved, thereby resulting in that the light emission shift register can still operate stably with a large dropout voltage between the first node N1 and the third node N3 and thus improving the circuit stability of the light emission shift register driven by the method for controlling light emission in this embodiment.

Figure 10:
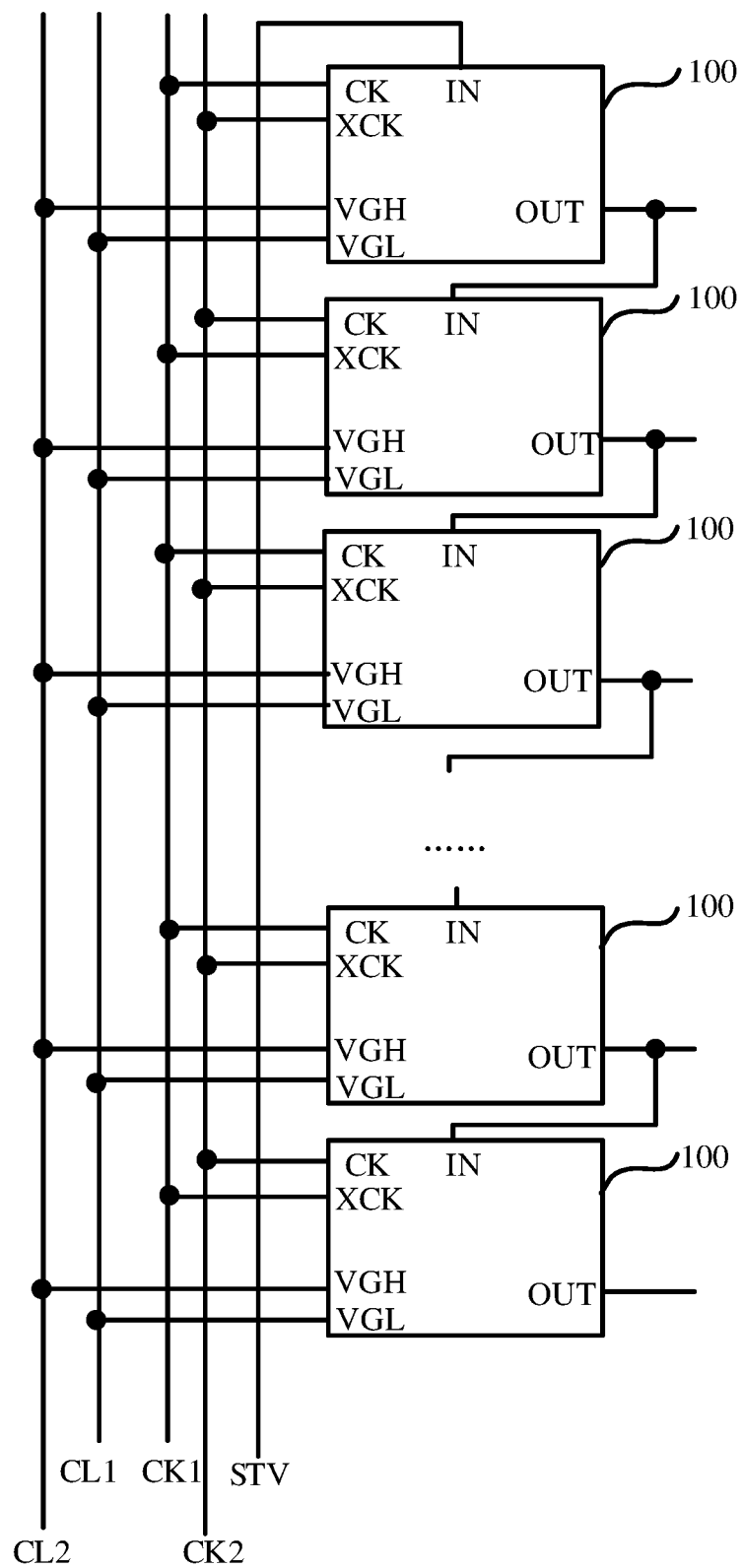
FIG. 10 is a schematic diagram of a driving circuit according to an embodiment of the present disclosure.

An embodiment of the present disclosure further provides a driving circuit. FIG. 10 is a schematic diagram of a driving circuit according to an embodiment of the present disclosure. As shown in FIG. 10, the driving circuit includes a light emission control circuit. The light emission control circuit includes a plurality of the abovementioned light emission shift registers 100 that is cascaded. The input signal terminal IN of the light emission shift register 100 at a $1^{st}$ stage is connected to a start signal terminal STY. The input signal terminal IN of the shift register 100 at each stage other than the $1^{St}$ stage of the plurality of cascaded light emission shift registers 100 is connected to the output signal terminal OUT of the shift register 100 at its previous stage.

In this embodiment, the first clock signal terminal CK of the shift register 100 at each odd numbered stage is configured to receive a first clock signal CK1 and the second clock signal terminal XCK of the shift register 100 at each odd numbered stage is configured to receive a second clock signal.

The first clock signal terminal CK of the shift register 100 at each even numbered stage is configured to receive the second clock signal CK2 and the second clock signal terminal XCK of the shift register 100 at each even numbered stage is configured to receive the first clock signal CK1.

When the first clock signal CK1 is at a low level, the second clock signal CK2 is at a high level.

When the second clock signal CK2 is at a low level, the first clock signal CK1 is at a high level.

With the driving circuit in this embodiment, the output signal terminal OUT of the light emission shift register can output an output signal which has a same polarity with the signal at the input signal terminal IN. That is, for high-level signals provided by the input signal terminal IN in the second phase t2 and in the third phase t3, the driving circuit provided in this embodiment can cause the output signal terminal OUT to output a high-level signal in the third phase t3 so as to achieve signal shift. Therefore, with the driving circuit in this embodiment, two output terminals of the light emission shift register in the prior art can be combined as one, that is, one output signal terminal OUT is connected to both the sub-pixels of the display panel and the input signal terminal IN of a next stage of light emission shift register, so that the number of terminals in the circuit can be reduced and the circuit structure of the light emission shift register can be simplified. Moreover, in this embodiment, a dual-gate transistor is provided between the first node N1 and the third node N3 of the second processing module 2 of the light emission shift register, so that the withstand voltage performance between the first node N1 and the third node N3 can be improved, thereby resulting in that the light emission shift register can still operate stably with a large dropout voltage between the first node N1 and the third node N3 and thus improving the circuit stability of the driving circuit in this embodiment.

In addition, in the driving circuit as shown in FIG. 10, each stage of shift register 100 has a first fixed potential terminal VGL connected to a driving chip (not shown) through a first voltage signal line CL1, and a second fixed potential terminal VGH connected to the driving chip through a second voltage signal line CL2.

Figure 11:
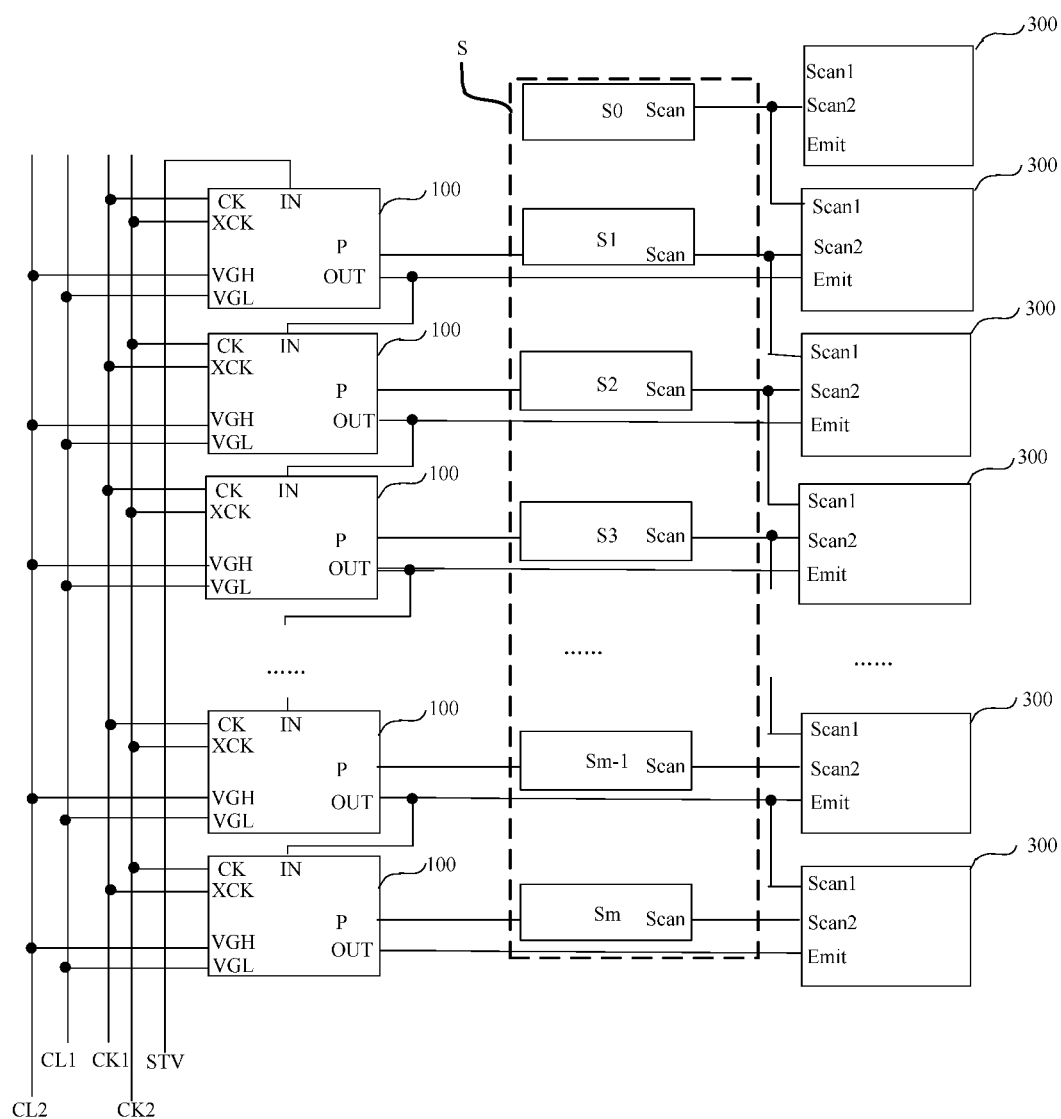
FIG. 11 is a schematic diagram of another driving circuit according to an embodiment of the present disclosure.

FIG. 11 is a schematic diagram of another driving circuit according to an embodiment of the present disclosure. In an embodiment, as shown in FIG. 11, the driving circuit further includes a scan driving circuit S. The scan driving circuit S includes a plurality of cascaded scan shift registers S0, S1, ..., Sm−1, Sm. Here, m is a positive integer larger than one. Each scan shift register includes a scan signal output terminal Scan, and a plurality of scan signal output terminals Scan is connected to a plurality of rows of sub-pixels 300 in the display panel for outputting scan signals to the plurality of rows of sub-pixels. In an example, a first row of sub-pixels 300 may be dummy pixels, which are not used for displaying during displaying of the display panel. With reference to the schematic diagram of the pixel driving circuit shown in FIG. 2, a plurality of scan signal output terminals Scan are respectively connected to the first scan signal terminals Scan1 and the second scan signal terminals Scan2 of a plurality of pixel driving circuits. For the first stage of scan shift register S1 shown in FIG. 11, the scan signal output terminal Scan of the first stage of scan shift register S1 is connected to both the second scan signal terminal Scan2 for the second row of sub-pixels 300 and the first scan signal terminal Scan1 for the third row of sub-pixels 300.

In an embodiment, the signal at the pulse signal terminal P of the abovementioned light emission shift register 100 is the same as the signal outputted by the scan signal output terminal Scan of the scan shift register, and the control terminal of the second transistor of the light emission shift register 100 is connected to the first node. The scan signal output terminal Scan of an $i^{th}$ stage of scan shift register S1 is connected to the pulse signal terminal P of the $i^{th}$ stage of light emission shift register 100, where i is a positive integer.

In this embodiment, the signal outputted from the scan signal output terminal of the scan shift register is used as the signal source of the pulse signal terminal P of the light emission shift register. That is, the output signal at the scan signal output terminal of the scan shift register is reused without providing an additional signal generator to supply the light emission shift register, and thus the number of components of the driving circuit can be reduced. In this case, when the driving circuit is used for a display panel, the occupied area of the display panel can be reduced, which facilitates narrow border design of the display panel.

Figure 12:
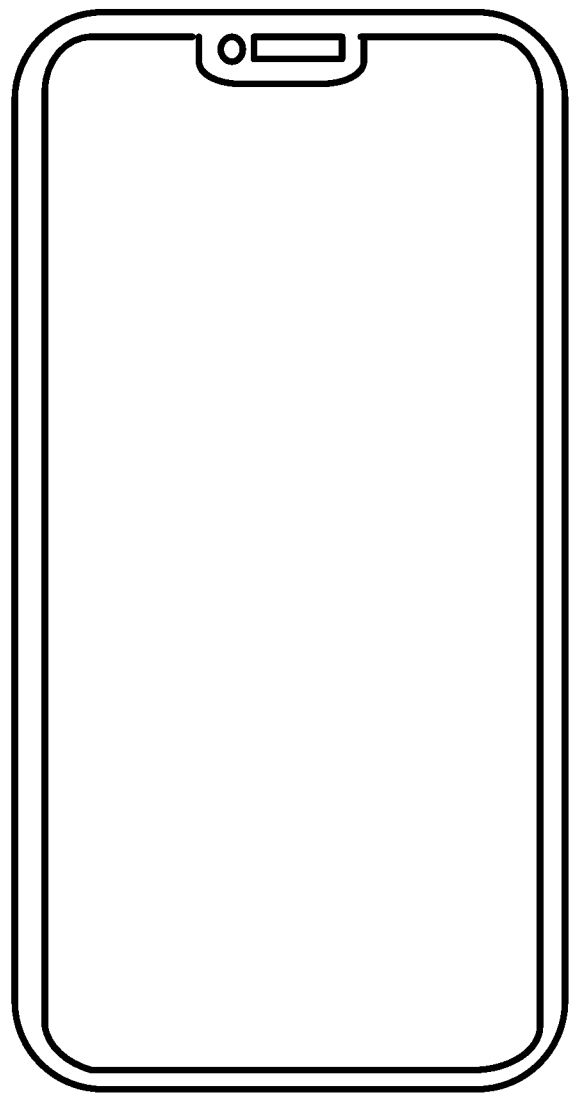
FIG. 12 is a schematic structural diagram of a display device according to an embodiment of the present disclosure.

An embodiment of the present disclosure provides a display device. FIG. 12 is a schematic structural diagram of a display device according to an embodiment of the present disclosure. As shown in FIG. 12, the display device includes the abovementioned driving circuit. The structure of the driving circuit has been described in detail in the above embodiments, and will not be further described herein. It should be noted that the display device shown in FIG. 12 is merely illustrative, and the display device can be any electronic device having a display function, such as a cellphone, a tablet computer, a notebook computer, or a television.

With the display device in this embodiment, the output signal terminal OUT of the light emission shift register can output an output signal which has a same polarity with the signal at the input signal terminal IN. That is, for high-level signals provided by the input signal terminal IN in the second phase t2 and in the third phase t3, the light emission shift register provided in this embodiment can output a high-level signal in the third phase t3 so as to achieve signal shift. Therefore, with the display device in this embodiment, two output terminals of the light emission shift register in the prior art can be combined as one, that is, one output signal terminal OUT is connected to both the sub-pixels of the display panel and the input signal terminal IN of a next stage of light emission shift register, so that the number of terminals in the circuit can be reduced and the circuit structure of the light emission shift register can be simplified. Moreover, in this embodiment, a dual-gate transistor is provided between the first node N1 and the third node N3 of the second processing module 2 of the light emission shift register, so that the withstand voltage performance between the first node N1 and the third node N3 can be improved, thereby resulting in that the light emission shift register can still operate stably with a large dropout voltage between the first node N1 and the third node N3 and thus improving the circuit stability of the driving circuit and further improving the display effect of the display device.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A driving circuit, comprising one or more light emission shift registers, wherein each of the one or more light emission shift registers comprises:
    a first processing module electrically connected to an input signal terminal, a first clock signal terminal and a second clock signal terminal, and configured to control a signal at a first node based on a signal at the input signal terminal, a signal at the first clock signal terminal and a signal at the second clock signal terminal;
    a second processing module electrically connected to a first level signal terminal, the first clock signal terminal, the second clock signal terminal, a pulse signal terminal and the first node, and configured to control a signal at a second node based on a signal at the first level signal terminal, the signal at the first clock signal terminal, the signal at the second clock signal terminal, a signal at the pulse signal terminal and the signal at the first node, wherein the second processing module comprises a first transistor and a second transistor, the first transistor is a dual-gate transistor having a control terminal electrically connected to the first node, a first terminal electrically connected to the first clock signal terminal and a second terminal electrically connected to a third node, and the second transistor has a control terminal electrically connected to the first node or the first clock signal terminal, a first terminal electrically connected to the pulse signal terminal and a second terminal electrically connected to the second node; and
    an output module electrically connected to the first level signal terminal, a second level signal terminal, the first node and the second node, and configured to control a signal at an output signal terminal based on the signal at the first level signal terminal, a signal at the second level signal terminal, the signal at the first node and the signal at the second node,
    wherein the first processing module comprises a third transistor, a fourth transistor, a fifth transistor, and a first capacitor,
    the third transistor has a control terminal electrically connected to the first clock signal terminal, a first terminal electrically connected to the input signal terminal, and a second terminal electrically connected to the first node;
    the fourth transistor has a control terminal electrically connected to the second clock signal terminal, a first terminal electrically connected to the first node, and a second terminal;
    the fifth transistor has a control terminal electrically connected to the third node, a first terminal electrically connected to the second terminal of the fourth transistor, and a second terminal electrically connected to the input signal terminal or the first clock signal terminal; and
    the first capacitor has a first terminal electrically connected to the first node, and a second terminal electrically connected to the second clock signal terminal.

2. The driving circuit according to claim 1, wherein the signal at the first level signal terminal is different from the signal at the second level signal terminal; the signal at the first clock signal terminal and the signal at the second clock signal terminal are both pulse signals, the signal at the second clock signal terminal is at a high level when the signal at the first clock signal terminal is at a low level, and the signal at the first clock signal terminal is at a high level when the signal at the second clock signal terminal is at a low level.

3. The driving circuit according to claim 1, wherein the signal at the pulse signal terminal is equal to the signal at the second clock signal terminal, and the control terminal of the second transistor is connected to the first clock signal terminal.

4. The driving circuit according to claim 3, wherein the second processing module further comprises a sixth transistor, a seventh transistor, an eighth transistor, a second capacitor, and a third capacitor;
   the sixth transistor has a control terminal electrically connected to the first clock signal terminal, a first terminal electrically connected to the first level signal terminal, and a second terminal electrically connected to the third node;
   the seventh transistor has a control terminal electrically connected to the third node, a first terminal electrically connected to the second clock signal terminal, and a second terminal electrically connected to a fourth node;
   the eighth transistor has a control terminal electrically connected to the second clock signal terminal, a first terminal electrically connected to the fourth node, and a second terminal electrically connected to the second node;
   the second capacitor has a first terminal electrically connected to the third node, and a second terminal electrically connected to the fourth node; and
   the third capacitor has a first terminal electrically connected to a fixed level signal terminal, and a second terminal electrically connected to the second node.

5. The driving circuit according to claim 4, wherein the second processing module further comprises a ninth transistor having a control terminal electrically connected to the input signal terminal, a first terminal electrically connected to the second clock signal terminal and a second terminal electrically connected to the first terminal of the second transistor.

6. The driving circuit according to claim 1, wherein the signal at the pulse signal terminal is equal to a signal at a scan signal output terminal of a scan shift register, and the control terminal of the second transistor is connected to the first node;
   in a case of the signal at the input signal terminal being at a high level, the signal at the first clock signal terminal being at a high level, and the signal at the second clock signal terminal being at a low level, the signal at the scan signal output terminal of the scan shift register is at a low level.

7. The driving circuit according to claim 6, wherein the second processing module further comprises a sixth transistor, a seventh transistor, an eighth transistor, a second capacitor, and a third capacitor;
   the sixth transistor has a control terminal electrically connected to the first clock signal terminal, a first terminal electrically connected to the first level signal terminal, and a second terminal electrically connected to the third node;
   the seventh transistor has a control terminal electrically connected to the third node, a first terminal electrically connected to the second clock signal terminal, and a second terminal electrically connected to a fourth node;
   the eighth transistor has a control terminal electrically connected to the second clock signal terminal, a first terminal electrically connected to the fourth node, and a second terminal electrically connected to the second node;
   the second capacitor has a first terminal electrically connected to the third node, and a second terminal electrically connected to the fourth node; and
   the third capacitor has a first terminal electrically connected to a fixed level signal terminal, and a second terminal electrically connected to the second node.

8. The driving circuit according to claim 1, wherein the output module comprises a tenth transistor and an eleventh transistor;
   the tenth transistor has a control terminal electrically connected to the first node, a first terminal electrically connected to the first level signal terminal, and a second terminal electrically connected to the output signal terminal; and
   the eleventh transistor has a control terminal electrically connected to the second node, a first terminal electrically connected to the second level signal terminal, and a second terminal electrically connected to the output signal terminal.

9. The driving circuit according to claim 1, wherein the one or more light emission shift registers comprise a plurality of light emission shift registers, and the plurality of light emission shift registers is cascaded, wherein the input signal terminal of the shift register at a $1^{st}$ stage of the plurality of light emission shift registers is connected to a start signal terminal, and the input signal terminal of the shift register at each stage other than the $1^{st}$ stage of the plurality of light emission shift registers is connected to the output signal terminal of the shift register at its previous stage,
   the first clock signal terminal of the shift register at each odd numbered stage of the plurality of light emission shift registers is configured to receive a first clock signal and the second clock signal terminal of the shift register at each odd numbered stage of the plurality of light emission shift registers is configured to receive a second clock signal,
   the first clock signal terminal of the shift register at each even numbered stage of the plurality of light emission shift registers is configured to receive the second clock signal and the second clock signal terminal of the shift register at each even numbered stage of the plurality of light emission shift registers is configured to receive the first clock signal,
   when the first clock signal is at a low level, the second clock signal is at a high level, and
   when the second clock signal is at a low level, the first clock signal is at a high level.

10. The driving circuit according to claim 9, wherein the driving circuit further comprises a scan driving circuit comprising a plurality of cascaded scan shift registers, and each of the plurality of cascaded scan shift registers comprises a scan signal output terminal for outputting a scan signal;
   the signal at the pulse signal terminal is the same as the scan signal at the scan signal output terminal, and the control terminal of the second transistor is connected to the first node; the scan signal output terminal of the scan shift register at an $i^{th}$ stage of the plurality of cascaded scan shift registers is connected to the pulse signal terminal of the light emission shift register at an $i^{th}$ stage of the plurality of light emission shift registers, where i is a positive integer.

11. A display device, comprising a driving circuit, wherein the driving circuit comprises one or more light emission shift registers, wherein each of the one or more light emission shift registers comprises:

a first processing module electrically connected to an input signal terminal, a first clock signal terminal and a second clock signal terminal, and configured to control a signal at a first node based on a signal at the input signal terminal, a signal at the first clock signal terminal and a signal at the second clock signal terminal;

a second processing module electrically connected to a first level signal terminal, the first clock signal terminal, the second clock signal terminal, a pulse signal terminal and the first node, and configured to control a signal at a second node based on a signal at the first level signal terminal, the signal at the first clock signal terminal, the signal at the second clock signal terminal, a signal at the pulse signal terminal and the signal at the first node, wherein the second processing module comprises a first transistor and a second transistor, the first transistor is a dual-gate transistor having a control terminal electrically connected to the first node, a first terminal electrically connected to the first clock signal terminal and a second terminal electrically connected to a third node, and the second transistor has a control terminal electrically connected to the first node or the first clock signal terminal, a first terminal electrically connected to the pulse signal terminal and a second terminal electrically connected to the second node; and an output module electrically connected to the first level signal terminal, a second level signal terminal, the first node and the second node, and configured to control a signal at an output signal terminal based on the signal at the first level signal terminal, a signal at the second level signal terminal, the signal at the first node and the signal at the second node, wherein the first processing module comprises a third transistor, a fourth transistor, a fifth transistor, and a first capacitor, the third transistor has a control terminal electrically connected to the first clock signal terminal, a first terminal electrically connected to the input signal terminal, and a second terminal electrically connected to the first node;

the fourth transistor has a control terminal electrically connected to the second clock signal terminal, a first terminal electrically connected to the first node, and a second terminal;

the fifth transistor has a control terminal electrically connected to the third node, a first terminal electrically connected to the second terminal of the fourth transistor, and a second terminal electrically connected to the input signal terminal or the first clock signal terminal; and the first capacitor has a first terminal electrically connected to the first node, and a second terminal electrically connected to the second clock signal terminal.

12. The display device according to claim 11, wherein the one or more light emission shift registers comprise a plurality of light emission shift registers, and the plurality of light emission shift registers is cascaded, wherein the input signal terminal of the shift register at a $1^{st}$ stage of the plurality of light emission shift registers is connected to a start signal terminal, and the input signal terminal of the shift register at each stage other than the $1^{st}$ stage of the plurality of light emission shift registers is connected to the output signal terminal of the shift register at its previous stage, the first clock signal terminal of the shift register at each odd numbered stage of the plurality of light emission shift registers is configured to receive a first clock signal and the second clock signal terminal of the shift register at each odd numbered stage of the plurality of light emission shift registers is configured to receive a second clock signal, the first clock signal terminal of the shift register at each even numbered stage of the plurality of light emission shift registers is configured to receive the second clock signal and the second clock signal terminal of the shift register at each even numbered stage of the plurality of light emission shift registers is configured to receive the first clock signal, when the first clock signal is at a low level, the second clock signal is at a high level, and when the second clock signal is at a low level, the first clock signal is at a high level.

13. The display device according to claim 12, wherein the driving circuit further comprises a scan driving circuit comprising a plurality of cascaded scan shift registers, and each of the plurality of cascaded scan shift registers comprises a scan signal output terminal for outputting a scan signal;

the signal at the pulse signal terminal is the same as the scan signal at the scan signal output terminal, and the control terminal of the second transistor is connected to the first node; the scan signal output terminal of the scan shift register at an $i^{th}$ stage of the plurality of cascaded scan shift registers is connected to the pulse signal terminal of the light emission shift register at an $i^{th}$ stage of the plurality of cascaded light emission shift registers, where i is a positive integer.

14. A method for controlling light emission, applied in a driving circuit, wherein the driving circuit comprises one or more light emission shift registers, wherein each of the one or more light emission shift registers comprises:

a first processing module electrically connected to an input signal terminal, a first clock signal terminal and a second clock signal terminal, and configured to control a signal at a first node based on a signal at the input signal terminal, a signal at the first clock signal terminal and a signal at the second clock signal terminal;

a second processing module electrically connected to a first level signal terminal, the first clock signal terminal, the second clock signal terminal, a pulse signal terminal and the first node, and configured to control a signal at a second node based on a signal at the first level signal terminal, the signal at the first clock signal terminal, the signal at the second clock signal terminal, a signal at the pulse signal terminal and the signal at the first node, wherein the second processing module comprises a first transistor and a second transistor, the first transistor is a dual-gate transistor having a control terminal electrically connected to the first node, a first terminal electrically connected to the first clock signal terminal and a second terminal electrically connected to a third node, and the second transistor has a control terminal electrically connected to the first node or the first clock signal terminal, a first terminal electrically connected to the pulse signal terminal and a second terminal electrically connected to the second node; and an output module electrically connected to the first level signal terminal, a second level signal terminal, the first node and the second node, and configured to control a signal at an output signal terminal based on the signal at the first level signal terminal, a signal at the second level signal terminal, the signal at the first node and the signal at the second node, wherein the method comprises:

in a first phase, providing a first level signal to the input signal terminal, a second level signal to the first clock signal terminal, and the first level signal to the second clock signal terminal, such that the first level signal is outputted at the output signal terminal;

in a second phase, providing the second level signal to the input signal terminal, the first level signal to the first clock signal terminal, and the second level to the second clock signal terminal, such that the first level signal is outputted at the output signal terminal;

in a third phase, providing the second level signal to the input signal terminal, the second level signal to the first clock signal terminal, and the first level signal to the second clock signal terminal, such that the second level signal is outputted at the output signal terminal; and in a fourth phase, providing the first level signal to the input signal terminal, the first level signal to the first clock signal terminal, the second level signal to the second clock signal terminal, and the second level signal to the pulse signal terminal, such that the first level signal is outputted at the output signal terminal.

15. The method according to claim 14, wherein the signal at the first level signal terminal is different from the signal at the second level signal terminal; the signal at the first clock signal terminal and the signal at the second clock signal terminal are both pulse signals, the signal at the second clock signal terminal is at a high level when the signal at the first clock signal terminal is at a low level, and the signal at the first clock signal terminal is at a high level when the signal at the second clock signal terminal is at a low level.

16. The method according to claim 14, wherein the first processing module comprises a third transistor, a fourth transistor, a fifth transistor, and a first capacitor, the third transistor has a control terminal electrically connected to the first clock signal terminal, a first terminal electrically connected to the input signal terminal, and a second terminal electrically connected to the first node;

the fourth transistor has a control terminal electrically connected to the second clock signal terminal, a first terminal electrically connected to the first node, and a second terminal;

the fifth transistor has a control terminal electrically connected to the third node, a first terminal electrically connected to the second terminal of the fourth transistor, and a second terminal electrically connected to the input signal terminal or the first clock signal terminal; and the first capacitor has a first terminal electrically connected to the first node, and a second terminal electrically connected to the second clock signal terminal.

17. The method according to claim 14, wherein the signal at the pulse signal terminal is the same as the signal at the second clock signal terminal, and the control terminal of the second transistor is connected to the first clock signal terminal.

18. The method according to claim 14, wherein the signal at the pulse signal terminal is the same as a signal at a scan signal output terminal of a scan shift register, and the control terminal of the second transistor is connected to the first node;

in a case of the signal at the input signal terminal being at a high level, the signal at the first clock signal terminal being at a high level, and the signal at the second clock signal terminal being at a low level, the signal at the scan signal output terminal of the scan shift register is at a low level.

19. A driving circuit, comprising one or more light emission shift registers, wherein each of the one or more light emission shift registers comprises:

a first processing module electrically connected to an input signal terminal, a first clock signal terminal and a second clock signal terminal, and configured to control a signal at a first node based on a signal at the input signal terminal, a signal at the first clock signal terminal and a signal at the second clock signal terminal;

a second processing module electrically connected to a first level signal terminal, the first clock signal terminal, the second clock signal terminal, a pulse signal terminal and the first node, and configured to control a signal at a second node based on a signal at the first level signal terminal, the signal at the first clock signal terminal, the signal at the second clock signal terminal, a signal at the pulse signal terminal and the signal at the first node, wherein the second processing module comprises a first transistor and a second transistor, the first transistor is a dual-gate transistor having a control terminal electrically connected to the first node, a first terminal electrically connected to the first clock signal terminal and a second terminal electrically connected to a third node, and the second transistor has a control terminal electrically connected to the first node or the first clock signal terminal, a first terminal electrically connected to the pulse signal terminal and a second terminal electrically connected to the second node; and an output module electrically connected to the first level signal terminal, a second level signal terminal, the first node and the second node, and configured to control a signal at an output signal terminal based on the signal at the first level signal terminal, a signal at the second level signal terminal, the signal at the first node and the signal at the second node, wherein the output module comprises a tenth transistor and an eleventh transistor;

the tenth transistor has a control terminal electrically connected to the first node, a first terminal electrically connected to the first level signal terminal, and a second terminal electrically connected to the output signal terminal; and the eleventh transistor has a control terminal electrically connected to the second node, a first terminal electrically connected to the second level signal terminal, and a second terminal electrically connected to the output signal terminal.

* * * * *